United States Patent
Oh et al.

(10) Patent No.: US 12,525,591 B2
(45) Date of Patent: Jan. 13, 2026

(54) THIN FILM TRANSISTOR AND DISPLAY PANEL USING THE SAME

(71) Applicant: LG Display Co., Ltd., Seoul (KR)

(72) Inventors: Kum Mi Oh, Paju-si (KR); Hyun Jin Kim, Paju-si (KR); Seung Hyo Ko, Paju-si (KR); Sun Wook Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 708 days.

(21) Appl. No.: 17/789,761

(22) PCT Filed: Sep. 1, 2020

(86) PCT No.: PCT/KR2020/011705
§ 371 (c)(1),
(2) Date: Jun. 28, 2022

(87) PCT Pub. No.: WO2021/137382
PCT Pub. Date: Jul. 8, 2021

(65) Prior Publication Data
US 2023/0062926 A1    Mar. 2, 2023

(30) Foreign Application Priority Data
Dec. 30, 2019    (KR) .................. 10-2019-0178023

(51) Int. Cl.
*H01L 25/16*    (2023.01)
*H10D 86/40*    (2025.01)
(Continued)

(52) U.S. Cl.
CPC .......... *H01L 25/167* (2013.01); *H10D 86/421* (2025.01); *H10D 86/423* (2025.01);
(Continued)

(58) Field of Classification Search
CPC .... H10D 86/60; H10D 86/421; H10D 86/441; H10D 86/481; H10D 86/423; H01L 25/167; H10K 19/10
See application file for complete search history.

(56) References Cited

U.S. PATENT DOCUMENTS 6,963,173 B2 * 11/2005 Kawachi ............ G09G 3/3233
345/92
9,897,881 B2 * 2/2018 Chen ................. H10D 30/6745
(Continued)

FOREIGN PATENT DOCUMENTS

KR    10-2007-0065187 A    6/2007
KR    10-2014-0075937 A    6/2014
(Continued)

*Primary Examiner* — Richard A Booth
(74) *Attorney, Agent, or Firm* — Seed Intellectual Property Law Group LLP

(57) ABSTRACT

A display panel according to one embodiment of the present disclosure includes a substrate, an active electrode over the substrate and including a source region, a drain region, and a channel region, and an active upper electrode of a curved shape over the active electrode. The channel region of the active electrode and the active upper electrode may overlap each other and the channel region may have a same shape as the active upper electrode. Accordingly, a driving element included in the display panel may generate a high driving current and the degree of integration in a pixel may be improved.

23 Claims, 15 Drawing Sheets

(51) Int. Cl.
*H10D 86/60* (2025.01)
*H10K 19/10* (2023.01)
(52) U.S. Cl.
CPC ......... *H10D 86/441* (2025.01); *H10D 86/481* (2025.01); *H10D 86/60* (2025.01); *H10K 19/10* (2023.02)

(56) References Cited

U.S. PATENT DOCUMENTS

| | | | |
|---|---|---|---|
| 2010/0151607 A1* | 6/2010 | Yamazaki | G02F 1/134363 |
| | | | 438/30 |
| 2011/0181561 A1* | 7/2011 | Smith | H10D 86/441 |
| | | | 345/204 |
| 2014/0159008 A1 | 6/2014 | Jeong et al. | |
| 2019/0172844 A1 | 6/2019 | Su et al. | |
| 2019/0189759 A1* | 6/2019 | Yong | H10D 30/6729 |

FOREIGN PATENT DOCUMENTS

| | | |
|---|---|---|
| KR | 20180005825 A | 1/2018 |
| KR | 10-2019-0074812 A | 6/2019 |
| WO | 2018/205450 A1 | 11/2018 |

\* cited by examiner

[Figure 1]
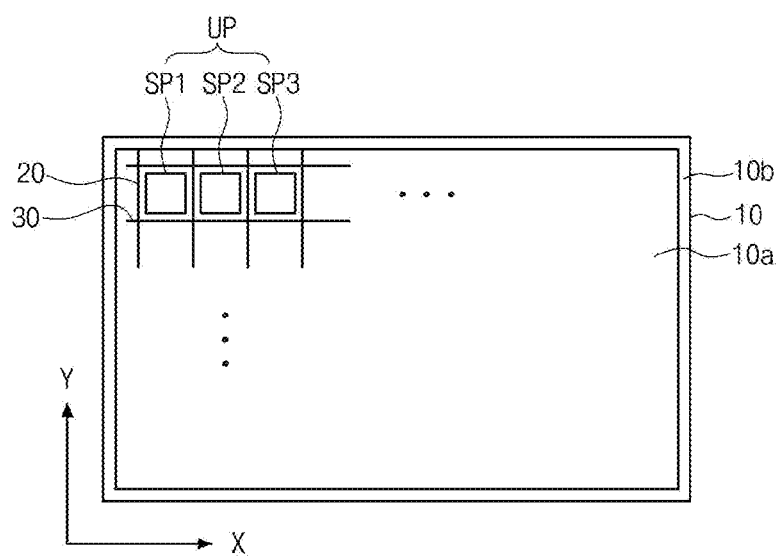

[Figure 2]
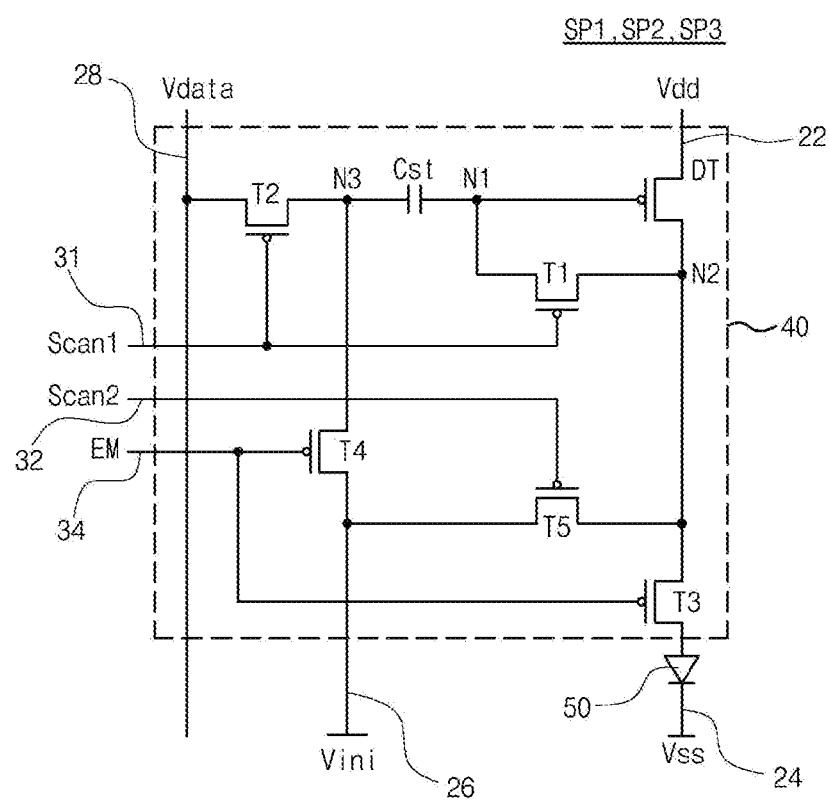

[Figure 3]
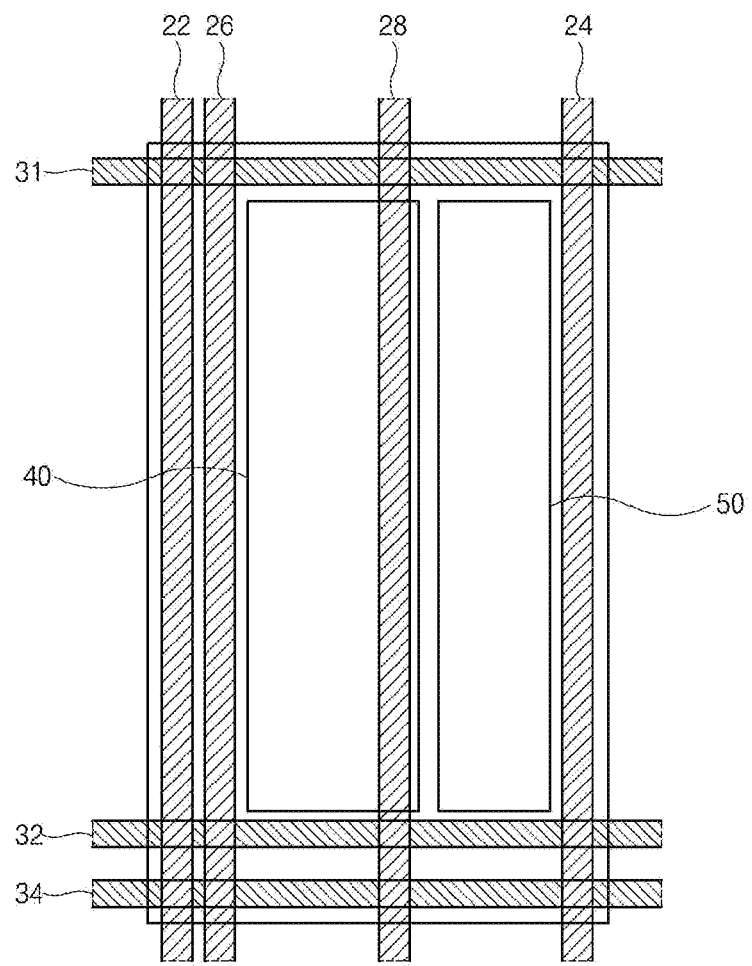

[Figure 4]
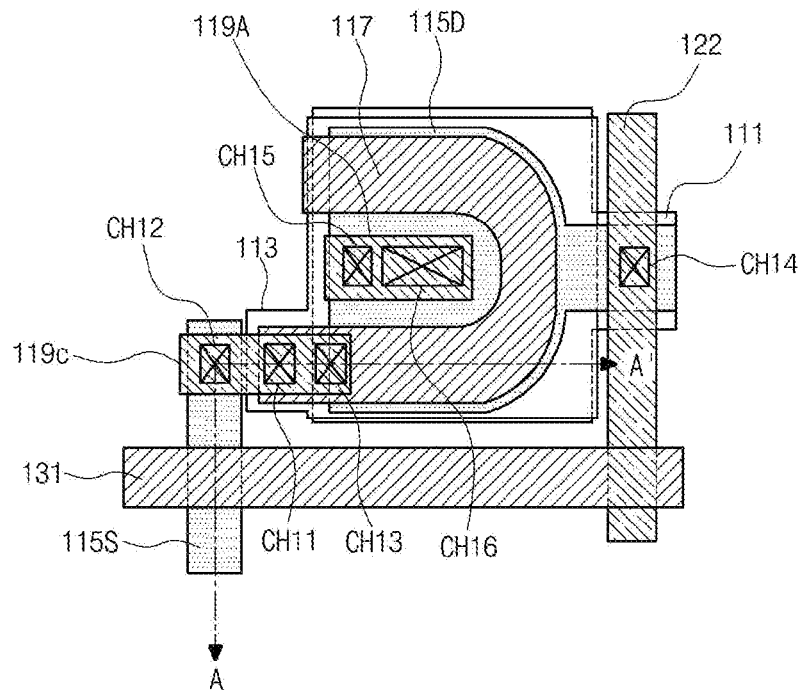
[Figure 5]
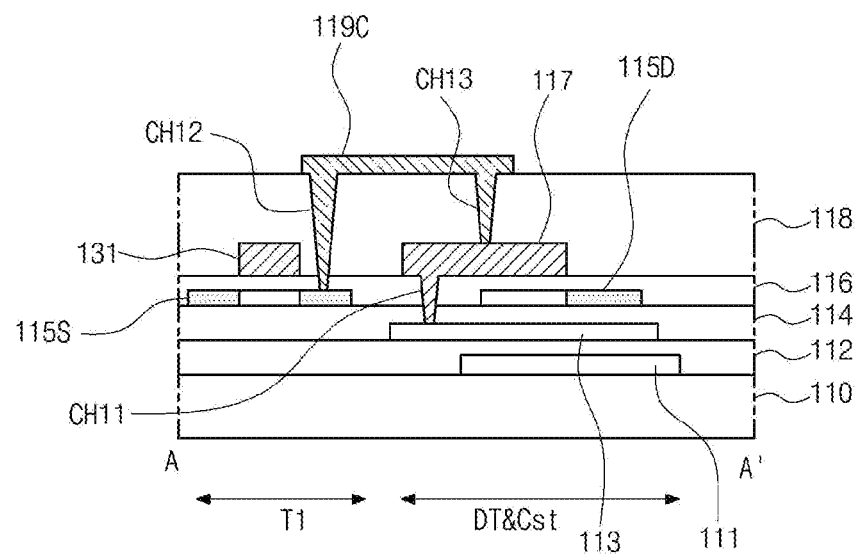

[Figure 6]
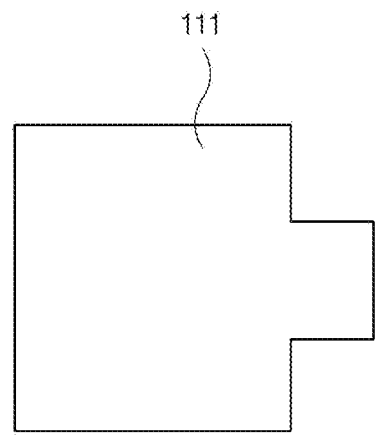
[Figure 7]
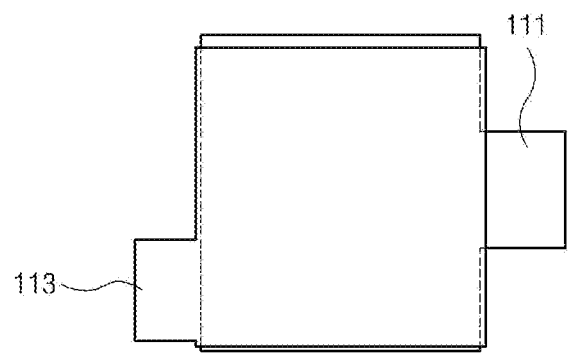

[Figure 8]
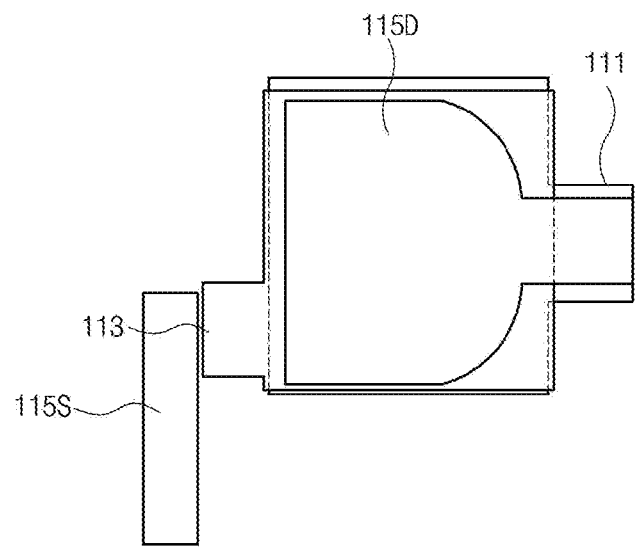
[Figure 9]
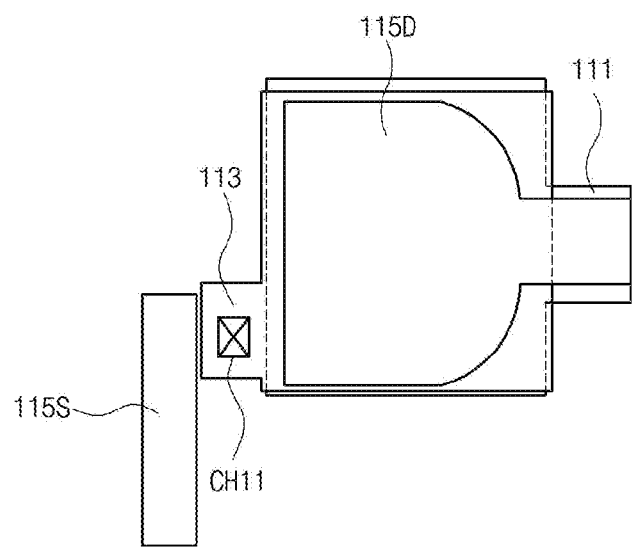

[Figure 10]
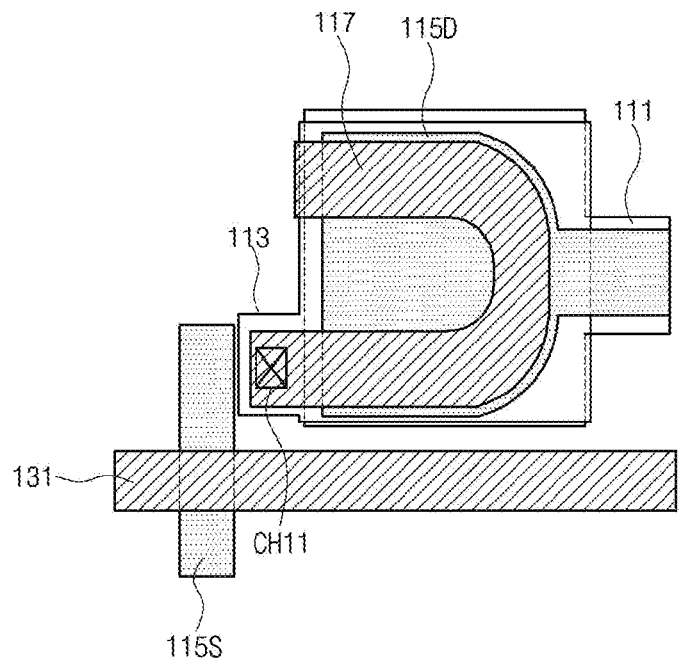
[Figure 11]
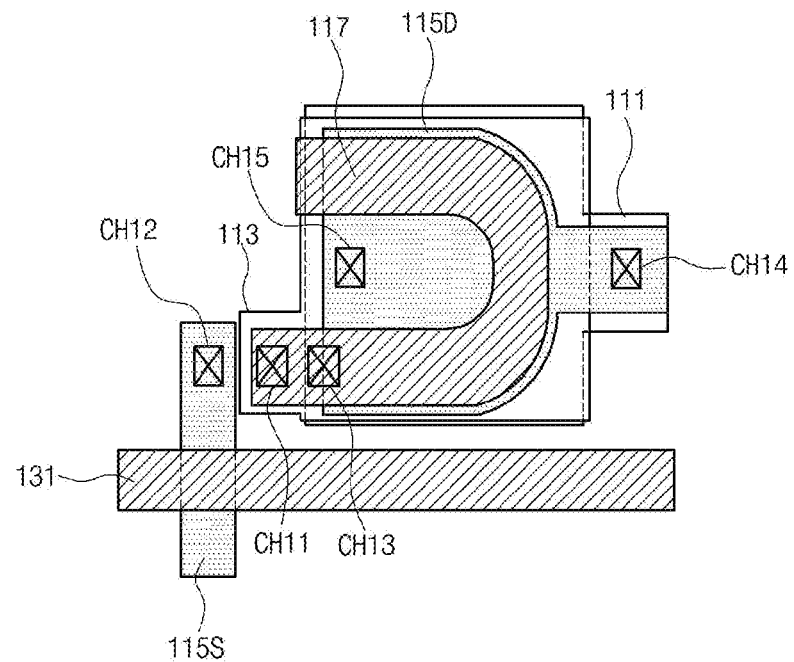

[Figure 12]
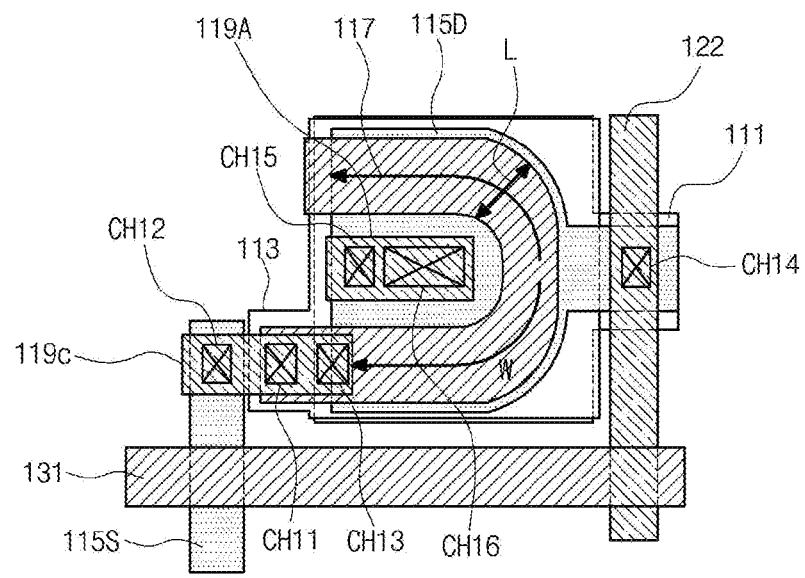
[Figure 13]
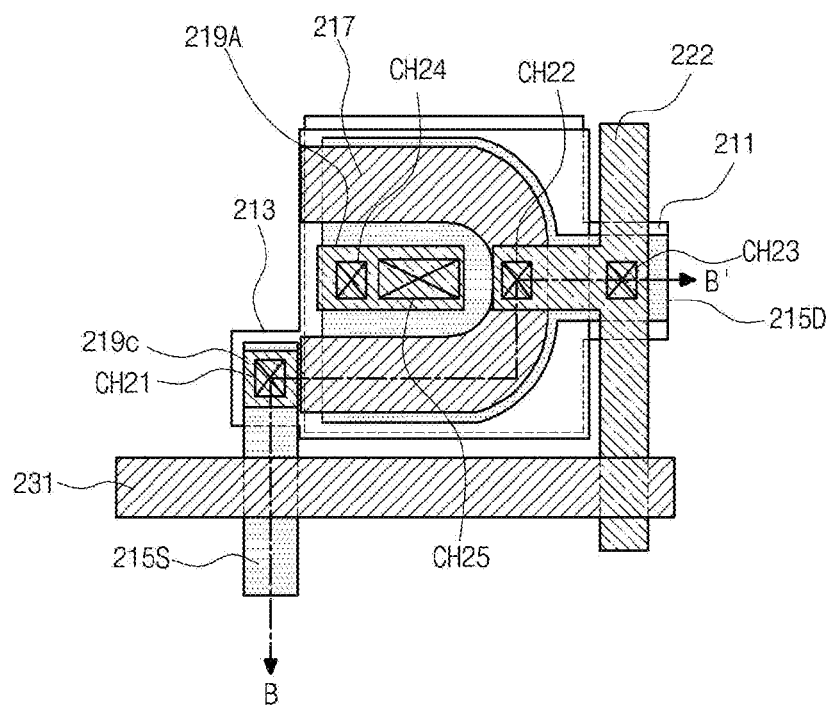

[Figure 14]
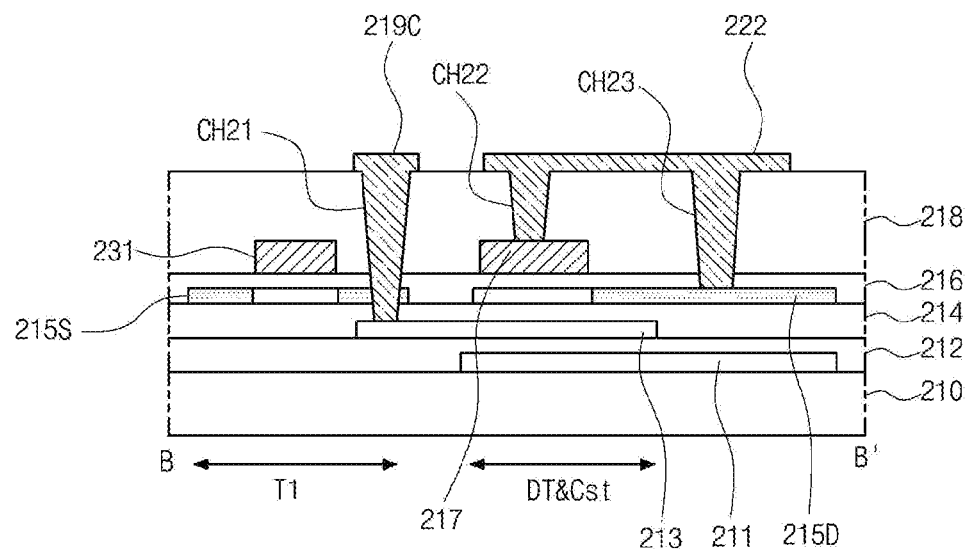
[Figure 15]
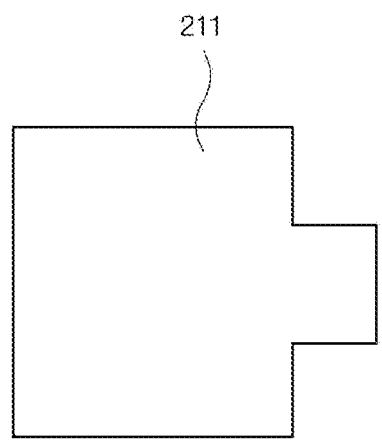

[Figure 16]
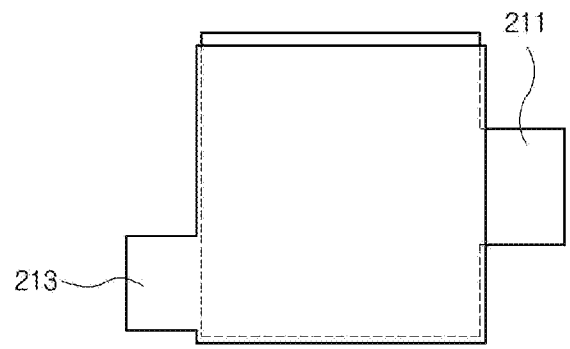
[Figure 17]
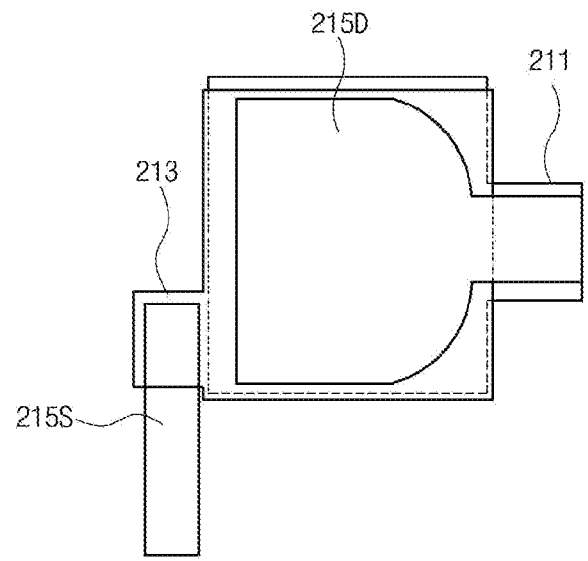

[Figure 18]
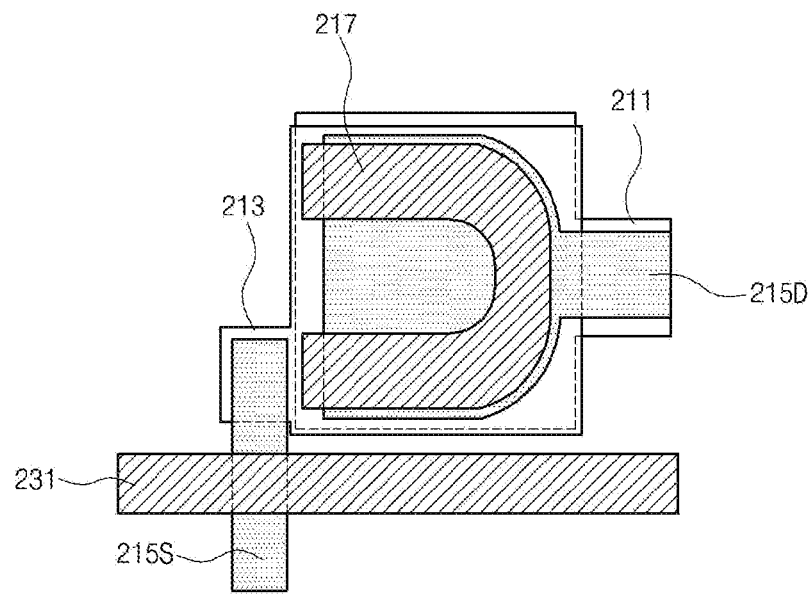
[Figure 19]
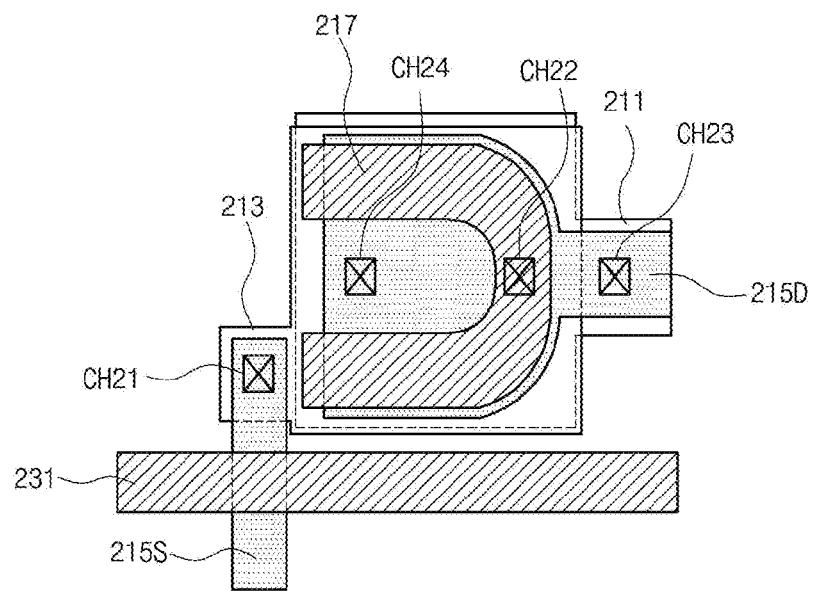

[Figure 20]
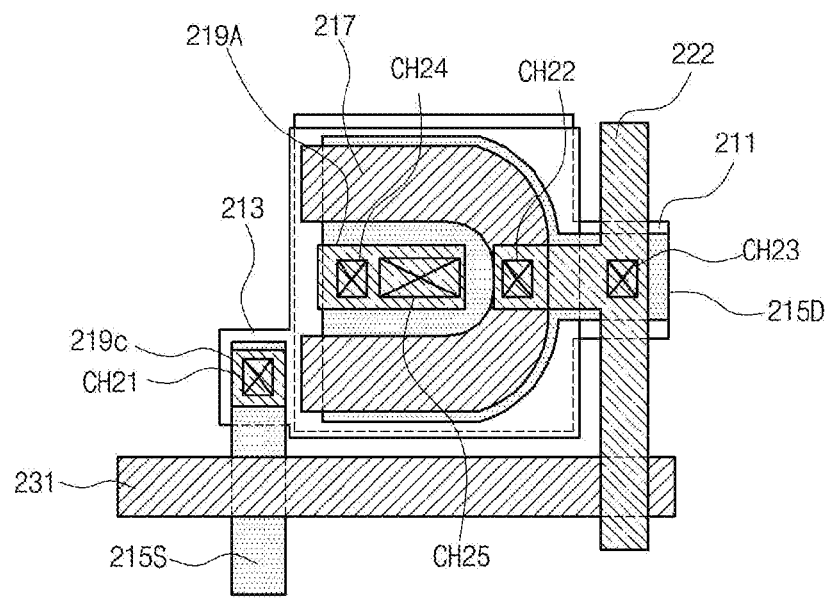
[Figure 21]
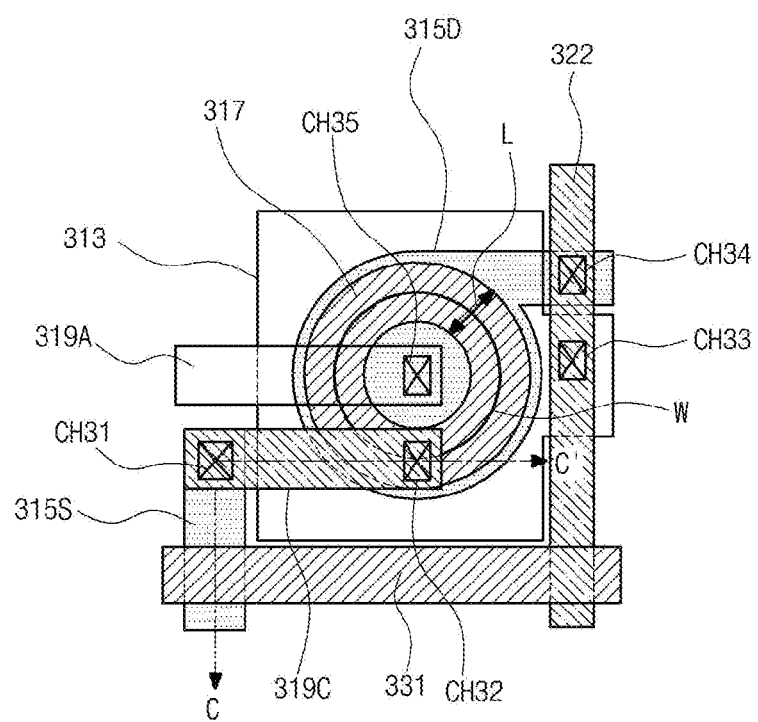

[Figure 22]
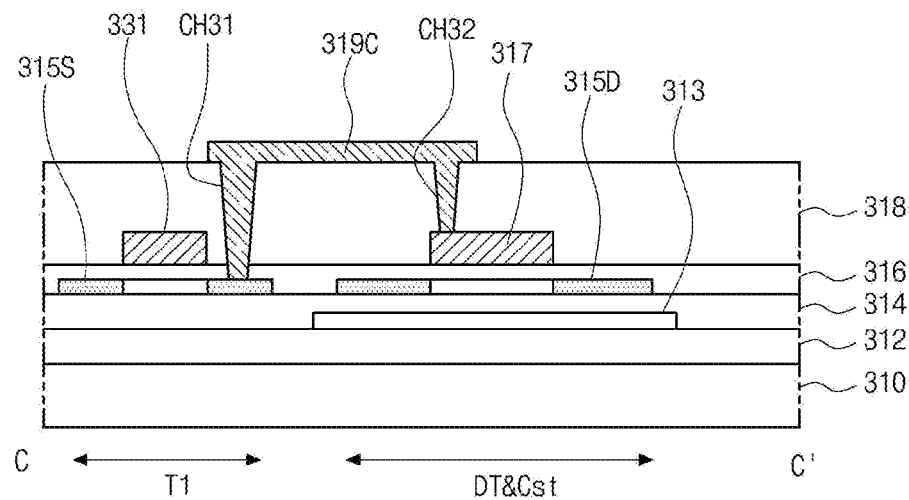
[Figure 23]
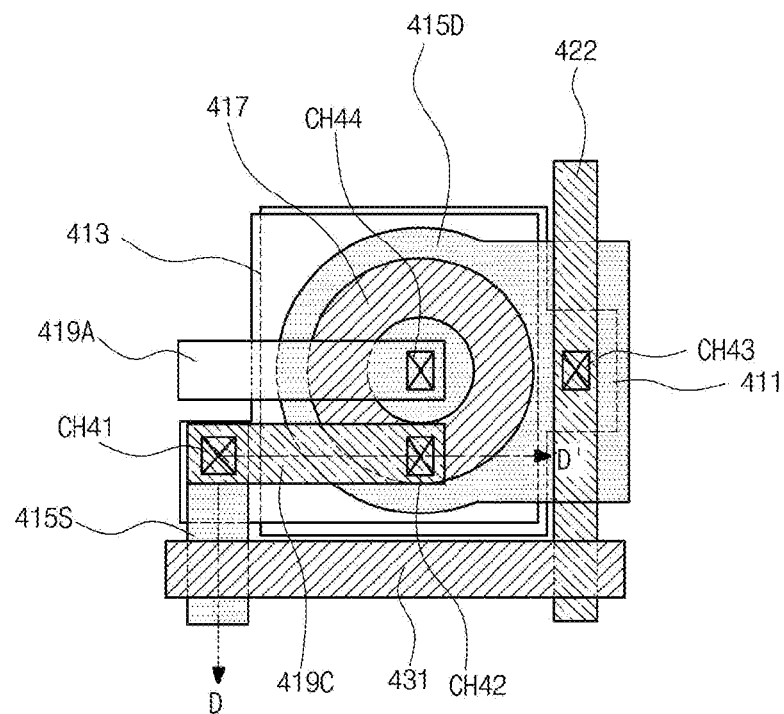

[Figure 24]
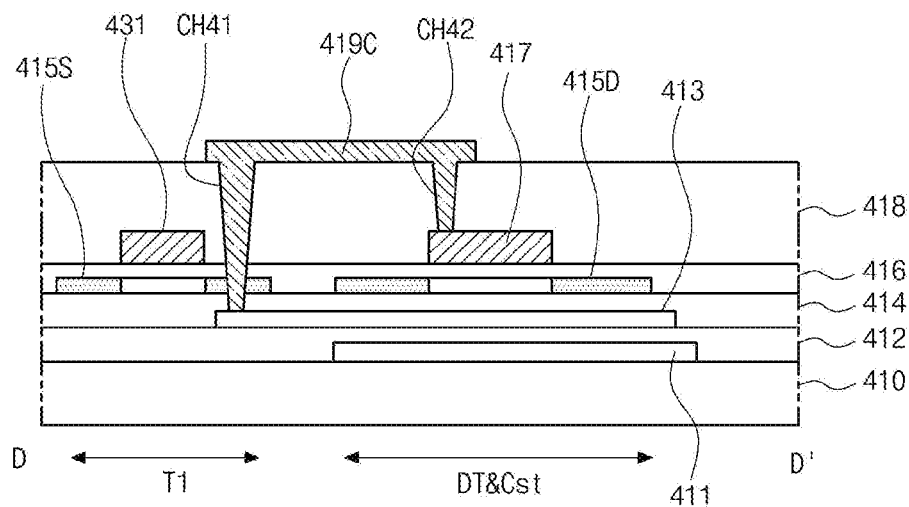
[Figure 25]
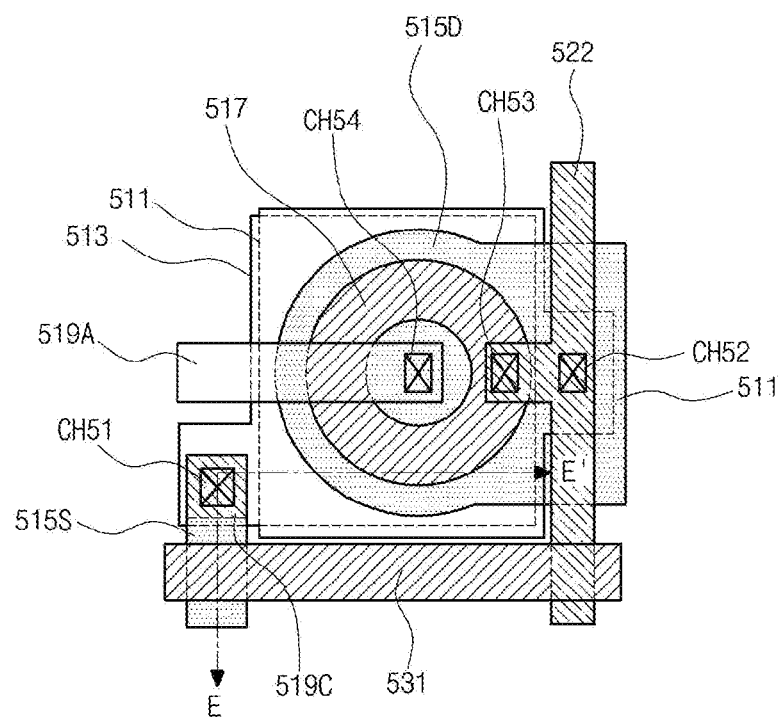

[Figure 26]
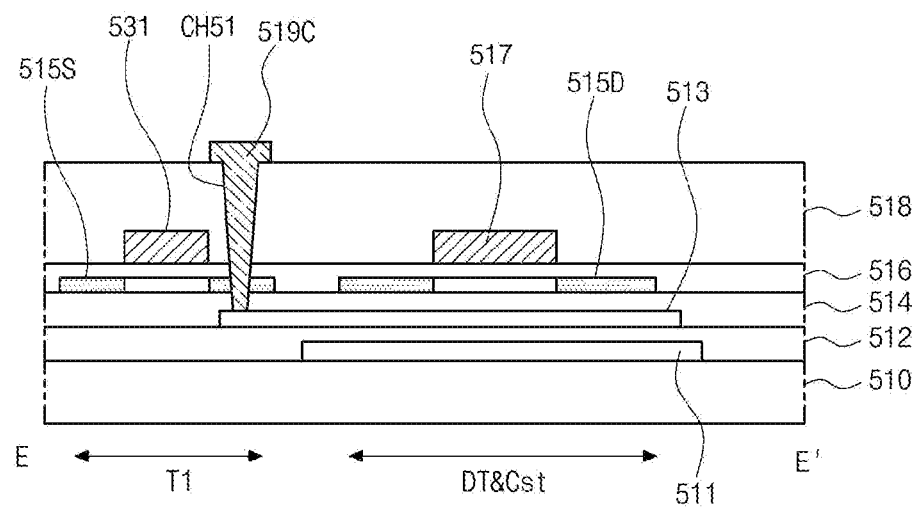

THIN FILM TRANSISTOR AND DISPLAY PANEL USING THE SAME

BACKGROUND

Technical Field

The present disclosure relates to a thin film transistor, and more particularly, to a thin film transistor capable of generating high driving currents and a display panel using the same.

Description of the Related Art

Liquid crystal display devices (LCD), organic light emitting display devices (OLED), and quantum dot display devices (QD), which have been widely used until now, have gradually expanded their application ranges.

In the above-described display devices, a plurality of light emitting elements is disposed on a substrate to realize an image, and a driving element for supplying a driving signal or a driving current is disposed on the substrate together with the light emitting elements to control each light emitting element to individually emit light, so that the plurality of light emitting elements disposed on substrate is interpreted and displayed on the substrate according to the arrangement of the information to be expressed.

Since the liquid crystal display device is not a self-luminous type, a backlight unit disposed to emit light on a rear surface of the liquid crystal display device is required. The backlight unit may increase the thickness of the liquid crystal display device, may have limitations in implementing the display device in various types of designs such as flexible or circular, and may reduce luminance and response speed.

Meanwhile, a display device having a self-luminous element can be implemented to be thinner than a display device having a built-in light source, and thus a flexible and foldable display device can be implemented. The display device having a self-luminous element may include an organic light emitting display device including an organic material as a light emitting layer and an LED display device using an LED (light emitting diode) as a light emitting element, and the self-luminous display device such as the organic light emitting display device or the LED display device can be used as a thinner or various types of display devices because it does not require a separate light source.

However, in the organic light emitting display device using the organic material, since defective pixels such as oxidation between the organic light emitting layer and the electrode due to the penetration of oxygen and moisture are easy to occur, various technical configurations are additionally required to minimize the penetration of oxygen and moisture.

In order to solve the above problems, recently, a display device employing an LED using an inorganic material as a light emitting element has been researched and developed, and such a light emitting display device has been in the spotlight as a next-generation display device because it has high definition and high reliability.

BRIEF SUMMARY

The LED element is a semiconductor element using a property that light is emitted when a current flows thorough a semiconductor and is widely used in various display devices such as a lighting, a TV, a signage display device, and a tiling display device. The LED element includes an n-type electrode, a p-type electrode, and an active layer therebetween. The n-type electrode and the p-type electrode are each formed of a semiconductor. When a current flows through the n-type electrode and the p-type electrode, electrons from the n-type electrode and holes from the p-type electrode are combined in the active layer to emit light.

The LED element is formed of a compound semiconductor such as GaN, so that it can inject high currents due to characteristics of inorganic materials, thereby realizing high luminance, and has high reliability because of its low susceptibility to the surroundings such as heat, moisture, oxygen, and so on.

In addition, since the LED element has an internal quantum efficiency of 90%, which is higher than that of an organic light emitting display device, it can display a high brightness image and has the advantage of implementing a display device with low power consumption.

In addition, since the LED element uses an inorganic material unlike the organic light emitting display device and is insignificantly affected by oxygen and moisture, it does not require a separate encapsulation film or encapsulation substrate for reducing the penetration of oxygen and moisture. Accordingly, there is an advantage in that the non-display area of the display device, which is a margin area that may be generated by disposing the encapsulation film or the encapsulation substrate, can be reduced.

However, a light emitting element such as the LED element needs a relatively high driving current compared to the liquid crystal display device or the organic light emitting display device. A pixel driving circuit includes a driving element for providing a constant current to the light emitting element. And, the light emitting element emits light by receiving a driving current from the pixel driving circuit connected to the light emitting element.

In order to generate a high driving current, a shape of an active electrode may be modified and designed, and in general, the driving current may be increased by forming a width of the active electrode to be large. In this case, a length of the active electrode is a numerical value in a direction in which carriers move, and the carriers move from a source region to a drain region of the active electrode. And, the width of the active electrode means a wideness of a path along which the carriers move. Specifically, the length and width of the active electrode means the length and width of a channel region, which is a path along which the carriers move.

However, when the width of the active electrode is formed to be large, the area occupied by the driving element in the pixel increases, and thus, as a high-resolution display panel is required, there is a limitation in reducing the pixel area.

Accordingly, the inventors of the present disclosure have recognized the various technical problems in the related art including the above-mentioned problems and have invented a driving element capable of generating a high driving current and a display panel using the same.

One of the problem to be solved according to an embodiment of the present disclosure is to provide a thin film transistor capable of improving the degree of integration in a pixel while generating a high driving current. However, the embodiments of the present disclosure are not confined to solving a single technical problem.

The technical benefits of the present disclosure for solving one or more problems in the related art are not limited to those mentioned above, and other benefits not mentioned will be clearly understood by one of skill in the art from the following description.

In a display panel according to one embodiment of the present disclosure, the display panel includes a substrate, an active electrode over the substrate and including a source region, a drain region, and a channel region, and an active upper electrode of a curved shape over the active electrode. The channel region of the active electrode and the active upper electrode overlap each other and the channel region can have a same shape as the active upper electrode. Accordingly, a driving element included in the display panel can generate a high driving current and the degree of integration in a pixel can be improved.

In a display panel according to one embodiment of the present disclosure, the display panel includes an active electrode including a source region, a drain region, and a channel region, an active upper electrode over the active electrode, overlapping the active electrode, and implemented in a curved shape, and an active lower electrode under the active electrode and overlapping the active electrode. The active upper electrode and the active lower electrode serve as a source electrode, a drain electrode, or a gate electrode. Accordingly, a driving element included in the display panel can generate a high driving current and the degree of integration in a pixel can be improved.

The details of other embodiments are included in the detailed description and drawings.

According to embodiments of the present disclosure, the display panel includes a thin film transistor in which the source electrode or the drain electrode is implemented in a curved shape, so that a high driving current can be provided to the light emitting element, thereby improving the luminance.

And, according to embodiments of the present disclosure, by implementing the thin film transistor and the capacitor to be overlapped, the degree of integration in the pixel can be improved, thereby implementing a high-resolution display device.

And, according to embodiment of the present disclosure, by implementing the width of the channel region of the active electrode of the thin film transistor to be longer than the length of the channel region, the thin film transistor can provide a high driving current to the light emitting element.

Since the contents of the disclosure described in problems to be solved, solutions for solving the problems, and effects above do not specify essential features of the claims, the scope of the claims is not limited by the matters described in the contents of the disclosure.

BRIEF DESCRIPTION OF THE SEVERAL VIEWS OF THE DRAWINGS

FIG. 1 is a plan view illustrating a display panel according to one embodiment of the present disclosure.

FIG. 2 is a circuit diagram illustrating a pixel driving circuit and a light emitting element according to one embodiment of the present disclosure.

FIG. 3 is a plan view of a subpixel according to one embodiment of the present disclosure.

FIG. 4 is a plan view illustrating a part of a pixel driving circuit according to one embodiment of the present disclosure.

FIG. 5 is a cross-sectional view taken along A-A' of FIG. 4.

FIGS. 6 to 12 are views illustrating a method of manufacturing the components shown in FIG. 4.

FIG. 13 is a plan view illustrating a part of a pixel driving circuit according to one embodiment of the present disclosure.

FIG. 14 is a cross-sectional view taken along B-B' of FIG. 13.

FIGS. 15 to 20 are views illustrating a method of manufacturing the components shown in FIG. 13.

FIG. 21 is a plan view illustrating a part of a pixel driving circuit according to one embodiment of the present disclosure.

FIG. 22 is a cross-sectional view taken along C-C' of FIG. 21.

FIG. 23 is a plan view illustrating a part of a pixel driving circuit according to one embodiment of the present disclosure.

FIG. 24 is a cross-sectional view taken along D-D' of FIG. 23.

FIG. 25 is a plan view illustrating a part of a pixel driving circuit according to one embodiment of the present disclosure.

FIG. 26 is a cross-sectional view taken along E-E' of FIG. 25.

DETAILED DESCRIPTION

Advantages and features of the present disclosure and methods of achieving them will become apparent with reference to embodiments described below in detail together with the accompanying drawings. However, the present disclosure is not limited to embodiments disclosed below, but will be implemented in a variety of different forms, only these embodiments are provided in order to allow the disclosure of the present disclosure to be complete and to completely inform the scope of the disclosure to those of ordinary skill in the art to which the present disclosure belongs.

Since the shapes, sizes, proportions, angles, numbers, etc., disclosed in the drawings for explaining embodiments of the present disclosure are illustrative, the present disclosure is not limited to the illustrated matters. Same reference numerals refer to same components throughout the disclosure. In addition, in describing the present disclosure, if it is determined that a detailed description of a related prior art may unnecessarily obscure the subject matter of the present disclosure, the detailed description will be omitted. When 'including,' 'having,' 'consisting of,' etc., mentioned in the present disclosure are used, other parts may be added unless 'only' is used. When a component is described in a singular, it includes a case in which the plural is included unless it is specifically explicitly described.

In interpreting the components, it is interpreted as including an error range even if there is no separate explicit description.

In the case of a description of the positional relationship, for example, when the positional relationship of two parts is described as 'on,' 'over,' etc., one or more other parts may be placed between two parts unless 'right,' 'directly' or 'adjacent' is used.

In the case of a description of a temporal relationship, for example, when a temporal order relationship is described with 'after,' 'following,' 'next,' 'before,' etc., it may include cases that are not continuous unless 'right' or 'directly' is used.

Each feature of various embodiments of the present disclosure may be partially or entirely united or combined with each other and may be technically variously interlocked and driven, and the embodiments may be implemented independently from each other or may be implemented together in a related relationship.

In the present disclosure, a gate driving portion and a pixel driving circuit formed on a substrate of a display panel may be implemented as n-type or p-type thin film transistors. For example, the thin film transistor may be implemented as a transistor having a MOSFET (metal oxide semiconductor field effect transistor) structure. A transistor is a three-electrode element including a gate electrode, a source electrode, and a drain electrode. The source electrode provides carriers to the transistor. In the transistor, the carriers begin to migrate from the source electrode. The drain electrode is an electrode through which the carriers exit from the transistor to the outside.

For example, in the transistor, the carriers move from the source electrode to the drain electrode. In the case of the n-type transistor, since the carriers are electrons, the voltage of the source electrode is lower than the voltage of the drain electrode so as to move from the source electrode to the drain electrode. In the n-type transistor, since electrons move from the source electrode to the drain electrode, oppositely, the direction of the current is from the drain electrode to the source electrode. In the case of the p-type transistor, since the carriers are holes, the voltage of the source electrode is higher than the voltage of the drain electrode so that the holes can move from the source electrode to the drain electrode. Since the holes of the p-type transistor move from the source electrode to the drain electrode, the direction of the current is from the source electrode to the drain electrode. The source electrode and the drain electrode of the transistor are not fixed, and the source electrode and the drain electrode of the transistor may be changed according to an applied voltage. Accordingly, the source electrode and the drain electrode may be referred to as a first electrode and a second electrode or a second electrode and a first electrode, respectively.

Hereinafter, a gate on voltage is a voltage of a gate signal at which the transistor can be turned on, and a gate off voltage is a voltage at which the transistor can be turned off.

Hereinafter, a thin film transistor and a display panel according to one embodiment of the present disclosure will be described with reference to the accompanying drawings. In this case, the thin film transistor is simply referred to as a transistor. In addition, since the source electrode and the drain electrode of the transistor including the driving transistor are determined according to the direction of the current, the source electrode mentioned below may be changed to a drain electrode, and the drain electrode may be changed to a source electrode.

FIG. 1 is a plan view illustrating a display panel according to one embodiment of the present disclosure. FIG. 2 is a circuit diagram illustrating a pixel driving circuit and a light emitting element according to one embodiment of the present disclosure. And, FIG. 3 is a plan view of a subpixel according to one embodiment of the present disclosure.

The display panel 10 according to one embodiment of the present disclosure includes a substrate divided into a display area 10a where a plurality of unit pixels UP is disposed and a non-display area 10b.

The unit pixel UP may be composed of a plurality of subpixels SP1, SP2, and SP3 on a front surface of the substrate and may typically include subpixels SP1, SP2, and SP3 emitting red, blue, and green light, but is not limited thereto, and may further include a subpixel emitting white light or the like.

The substrate is an array substrate on which transistors are formed and includes a plastic material or a glass material. The substrate according to an example may include an opaque or colored polyimide material. In this case, a back plate coupled to the rear surface of the substrate may be further included in order to maintain the display panel 10 in a planar state. The back plate according to the example may include a plastic material, for example, a polyethylene terephthalate material. The substrate according to the example may be a glass substrate. For example, the substrate of the glass material may be a thin glass substrate having a thickness of 100 or less and may have a flexible property. In addition, the substrate may be divided into the attachment of two or more substrates or two or more layers.

The non-display area 10b may be defined as an area on the substrate excluding the display area 10a, may have a relatively narrow width (or size) compared to the display area 10a, and may be defined as a bezel area.

Each of the plurality of unit pixels UP is disposed in the display area 10a. In this case, each of the plurality of unit pixels UP is disposed in the display area 10a so as to have a first reference pixel pitch predetermined along the X-axis direction and a second reference pixel pitch preset along the Y-axis direction. Each of the first reference pixel pitch and the second reference pixel pitch may be defined as a distance between central portions of respective unit pixels UP adjacent in the X-axis direction or the Y-axis direction.

And, the distance between the subpixels SP1, SP2, and SP3 constituting the unit pixel UP may be also defined as a first reference subpixel pitch and a second reference subpixel pitch similarly to the first reference pixel pitch and the second reference pixel pitch.

In the display panel 10 including an LED element 50, a width of the non-display area 10b may be smaller than the pixel pitch or the subpixel pitch, and for example, when a tiling display device is implemented with the display panel 10 having the non-display area 10b of a length equal to or smaller than the pixel pitch or the subpixel pitch, a tiling display device having substantially no bezel area can be implemented because the non-display area 10b is smaller than the pixel pitch or the subpixel pitch.

In order to implement the tiling display device or a multi-screen display device in which the bezel area does substantially not exist or is reduced, the display panel 10 may constantly maintain the first reference pixel pitch, the second reference pixel pitch, the first reference subpixel pitch, and the second reference subpixel pitch, but the size of the bezel area can be made relatively smaller than the pixel pitch by defining the display area 10a as a plurality of sections and by differing lengths of the above-described pitches in respective sections such that the pixel pitch in the section adjacent to the non-display area 10b can be wider than those in other sections. In this case, since the display panel 10 having the different pixel pitches may cause an image distortion, the image processing is performed by comparing and sampling with an adjacent section in consideration of the set-up pixel pitch, so that the bezel area can be reduced while removing the image distortion.

A configuration of the subpixels SP1, SP2, and SP3 constituting the unit pixel UP of the display panel 10 and a driving circuit will be described with reference to FIG. 2 and FIG. 3. The pixel driving lines are provided on the substrate to supply signals for each of the plurality of subpixels SP1, SP2, and SP3. The pixel driving lines according to one embodiment of the present disclosure may be divided into horizontal axis lines 30 and vertical axis lines 20. The horizontal axis lines 30 may include scan lines 31 and 32 and an emission line 34, and the vertical axis lines 20 may include a data line 28 and power lines 22, 24, and 26. The scan lines include a first scan line 31 providing a first scan signal Scan1, a second scan line 32 providing a second scan signal Scan2, and an emission line 34 providing an emission signal EM, and the power lines include a high potential power line 22 providing a high potential power voltage Vdd, a low potential power line 24 providing a low potential power voltage Vss, and an initialization voltage line 26 providing an initialization voltage Vini. The scan lines and the emission line may be collectively referred to as gate lines.

The gate lines are provided on the substrate and are spaced apart from each other at regular intervals along the vertical axis direction Y while extending long along the horizontal axis direction X of the substrate.

The data lines are provided on the substrate to cross the gate lines and are spaced apart from each other at regular intervals along the horizontal axis direction X while extending long along the vertical axis direction Y of the substrate.

The power lines are provided on the substrate to be parallel to the data line 28 and may be formed together with the data line 28. And, the power lines provide the pixel driving power source supplied from the outside to the subpixels SP1, SP2, and SP3 adjacent thereto, respectively. For example, one power lines 22, 24, and 26 may be provided for each of the plurality of unit pixels UP. In this case, at least three subpixels SP1, SP2, and SP3 constituting the unit pixel UP share one power lines 22, 24, and 26. Accordingly, the number of power lines for driving each of the subpixels SP1, SP2, and SP3 can be reduced, and the aperture ratio of each unit pixel UP may be increased by the reduced number of power lines or the size of each unit pixel may be decreased.

Each of the subpixels SP1, SP2, and SP3 is provided in a subpixel area defined by the gate lines 31, 32, and 34 and the data line 28. And, each of the subpixels SP1, SP2, and SP3 may be defined as an area of a minimum unit in which light is actually emitted.

At least three subpixels SP1, SP2, and SP3 adjacent to each other may constitute one unit pixel UP for displaying colors. For example, one unit pixel UP includes a red subpixel SP1, a green subpixel SP2, and a blue subpixel SP3 adjacent to each other along the horizontal axis direction X, and may further include a white subpixel for improving the luminance. Although the arrangement structure of the subpixels shown in the present disclosure is a stripe shape, it is not limited thereto.

Each of the plurality of subpixels SP1, SP2, and SP3 according to one embodiment of the present disclosure includes a pixel driving circuit 40 and an LED element 50.

The pixel driving circuit 40 is provided in a circuit region defined in each of the subpixels SP1, SP2, and SP3 and is connected to the gate lines 31, 32, and 34, the data line 28, and the power lines 22, 24, and 26 adjacent thereto. Based on a pixel driving power supplied through the power lines 22, 24, and 26, the pixel driving circuit 50 responds to a scan pulse provided through the gate lines 31, 32, and 34 and controls a current flowing through the LED element 50 according to a data voltage provided through the data line 28.

The pixel driving circuit 40 according to one embodiment of the present disclosure includes a first transistor T1, a second transistor T2, a third transistor T3, a fourth transistor T4, a fifth transistor T5, a driving transistor DT, and a capacitor Cst. The first transistor T1 to the fifth transistor T5 and the driving transistor DT may be implemented as a PMOS-type thin film transistor, and through this, response characteristics of the pixel driving circuit 40 can be secured. However, the technical spirit of the present disclosure is not limited thereto. For example, at least one transistor of the first transistor to the fifth transistor T1~T5 and the driving transistor DT may be implemented as an NMOS-type thin film transistor having good off-current characteristics, and the remaining transistors may be implemented as a PMOS-type thin film transistor having good response characteristics.

The LED element 50 is mounted in each of the subpixels SP1, SP2, and SP3. The LED element 50 is electrically connected to the pixel driving circuit 40 and the low potential power line 24 of the corresponding subpixel, thereby emitting light due to the current flowing from the pixel driving circuit 40, specifically, the driving transistor DT to the low potential power line 24. The LED element 24 according to one embodiment of the present disclosure may be an optical element or a light emitting diode chip emitting any one of red, green, blue, and white. Here, the light emitting diode chip may have a scale of 1 to 100 micrometers, but is not limited thereto, and may have a smaller size than the size of the remaining light emitting region excluding the circuit region occupied by the pixel driving circuit 40 in the area of the subpixel SP1, SP2, and SP3.

The driving transistor DT is a driving element controlling the current flowing through the LED element 50 according to a gate-source voltage of the driving transistor DT. The driving transistor DT includes a gate electrode connected to a first node N1, a source electrode connected to the high potential power line 22, and a drain electrode connected to a second node N2. The driving transistor DT may be implemented as a transistor to which a novel gate structure according to one embodiment of the present disclosure is applied in order to provide a high driving current to the LED element 50.

The first transistor T1 is connected between the first node N1 and the second node N2 and is controlled according to the first scan signal Scan1. A gate electrode of the first transistor T1 is connected to the first scan line 31 to which the first scan signal Scan1 is applied. The first transistor T1 is diode-connected by connecting the gate electrode and the drain electrode of the driving transistor DT when it is turned on. In this case, the first transistor T1 senses and compensates a threshold voltage factor of the driving transistor DT.

The second transistor T2 is connected between the data line 28 and a third node N3 and is controlled according to the first scan signal Scan1. A gate electrode of the second transistor T2 is connected to the first scan line 31. The second transistor T2 is turned on to apply a data voltage Vdata to the third node N3.

The third transistor T3 is connected between the second node N2 and the LED element 50 and is controlled according to the emission signal EM provided through the emission line 34. The third transistor T3 is turned on to provide a current flowing through the driving transistor DT to the LED element 50. The third transistor T3 controls the LED element 50 having a low emission threshold voltage not to emit light due to the initialization voltage Vini.

The fourth transistor T4 is connected between the third node N3 and the initialization voltage line 26 and is controlled according to the emission signal EM. The fourth transistor T4 is turned on to provide the third node N3 with the initialization voltage Vini supplied through the initialization voltage line 26, thereby initializing the voltage of the third node N3.

The fifth transistor T5 is connected between the second node N2 and the initialization voltage line 26 and is controlled according to the second scan signal Scan2 supplied through the second scan line 32. The fifth transistor T5 is turned on to provide the initialization voltage Vini to the second node N2, thereby discharging the voltage of the second node N2.

The capacitor Cst is provided in an overlapping region of the first node N1 and the third node N3 to store a voltage corresponding to the data voltage Vdata supplied to the gate electrode of the driving transistor DT and to turn on the driving transistor DT by the stored voltage.

Next, the operation of the pixel driving circuit 40 will be described. The operation of the pixel driving circuit 40 of FIG. 2 may be divided into a first initialization period, a second initialization period, a compensation period, a preservation period, and an emission period. In the first initialization period, since the emission signal EM and the second scan signal Scan2 are in the gate-on voltage state, the voltage of the third node N3 is initialized, and the LED element 50 maintains the light-emitting state. In the second initialization period, the emission signal EM is converted to the gate-off voltage, the first scan signal Scan1 is converted to the gate-on voltage, the second scan signal Scan2 maintains the gate-on voltage, so that the LED element 50 stops emitting light and the data voltage Vdata is applied to the third node N3. In the compensation period, the second scan signal Scan2 is converted to the gate-off voltage, and the first transistor T1 is turned on, so that the driving transistor DT is diode-connected to perform the compensation process of the threshold voltage. In the preservation period, since the first scan signal Scan1, the second scan signal Scan2, and the emission signal EM are all gate-off voltage states, the voltage applied in the previous period is maintained at each node. During the emission period, the emission signal EM is converted to the gate-on voltage, and the LED element 50 emits light due to the driving current provided from the driving transistor DT. In this case, the initialization voltage Vini is lower than the high potential power voltage and greater than the low potential power voltage. Since the driving current of the above-mentioned pixel driving circuit 40 is not affected by the high potential power voltage, a uniform image quality can be realized in a high-resolution display device.

The pixel driving circuit 40 according to one embodiment of the present disclosure is not limited to the configuration of the first transistor to the fifth transistor T1~T5, the driving transistor DT, and the capacitor Cst mentioned above, and may further include an auxiliary transistor and/or auxiliary capacitor or the like controlled by an additional emission signal EM.

Referring to FIG. 3, the gate lines 31 and 32, the emission line 34, the data line 28, and the power lines 22, 24, and 26 are disposed in one subpixel, and the pixel driving circuit 40 and the LED element 50 are disposed in different regions. The subpixel according to one embodiment of the present disclosure is not limited to the drawing illustrated in FIG. 3, and the pixel driving circuit 40 may be disposed to overlap the LED element 50. In this case, the area utilization in the subpixel is improved, so that the size of the pixel required in the high-resolution display panel can be achieved.

FIG. 4 is a plan view illustrating a part of a pixel driving circuit according to one embodiment of the present disclosure. And, FIG. 5 is a cross-sectional view taken along A-A' of FIG. 4.

As described in FIG. 2, each subpixel SP1, SP2, and SP3 of the display panel 10 according to one embodiment of the present disclosure includes the pixel driving circuit 40 and the LED element 50. Among various components constituting the pixel driving circuit 40, the driving transistor DT, which is a component of applying a driving current (or light emission current) to the LED element 50, and the first transistor T1 and the capacitor Cst, which are connected to the gate electrode of the driving transistor DT, will be described.

FIG. 4 is a plan view of the driving transistor DT including an active upper electrode implemented in a U-shape. The driving transistor DT includes an active lower electrode 113, an active upper electrode 117, an active electrode 115D, a source electrode, and a drain electrode 119A. In the driving transistor DT according to one embodiment of the present disclosure, since the active lower electrode 113 and the active upper electrode 117 are used as gate electrodes, the driving transistor DT is implemented as a double gate type transistor. And, the first transistor T1 includes a gate electrode 131, an active electrode 115S, a source electrode, and a drain electrode.

The source electrode of the driving transistor DT is implemented by being directly connected to the high potential power line 122 through a CH14 contact hole CH14, and the drain electrode 119A is connected to the third transistor T3 through a CH16 contact hole CH16. In some cases, the third transistor T3 may be omitted, and the drain electrode 119A of the driving transistor DT may be connected to an anode electrode of the LED element 50.

In the driving transistor DT, the active lower electrode 113 is disposed on a lower portion and the active upper electrode 117 is disposed on an upper portion with respect to the active electrode 115D of the driving transistor DT, and the active lower electrode 113 and the active upper electrode 117 are in contact with each other. A cap electrode 111 overlapping the active lower electrode 113 is disposed under the active lower electrode 113 of the driving transistor DT. The active lower electrode 113 and the cap electrode 111 overlap each other to form the capacitor Cst. The cap electrode 111 may be referred to as a lower electrode.

The gate electrodes 113 and 117 of the driving transistor DT are electrically connected to a source region or a drain region of the active electrode 115S of the first transistor T1 through a connection electrode 119C. The source electrode or the drain electrode of the first transistor T1 connected to the gate electrodes 113 and 117 of the driving transistor DT may not be separately provided and may be implemented by directly connecting the connection electrode 119C to the active electrode 115S of the first transistor T1.

The gate electrode 131 of the first transistor T1 is disposed over and overlaps the active electrode 115S.

As mentioned above, the active upper electrode 117 of the driving transistor DT is implemented as a U-shaped structure. A channel region of the driving transistor DT is formed in the same shape as the active upper electrode 117, and the driving transistor DT having a channel width W of FIG. 12 greater than a channel length L of eh 5g can be implemented. Since the driving current of the driving transistor DT is proportional to the channel width W of FIG. 12 and inversely proportional to the channel length L of FIG. 12, the driving current can be increased by increasing the channel width W of FIG. 12 more than the channel length L of FIG. 12, so that the heat concentration region can be uniformly distributed, thereby improving the reliability of the driving transistor DT.

In the driving transistor DT according to one embodiment of the present disclosure, the gate electrodes 113 and 117 are implemented in the U-shape, so that the channel width W of FIG. 12 can be increased while decreasing the area occupied by the driving transistor DT.

In addition, since the capacitor Cst can be formed to overlap the driving transistor DT by implementing the driving transistor DT as a double gate type transistor and disposing the cap electrode 111 under the driving transistor DT, it is not necessary to prepare a separate area for forming the capacitor Cst in the subpixel, so that the area occupied by the pixel driving circuit can be reduced.

FIGS. 6 to 12 are views illustrating a method of manufacturing the components shown in FIG. 4. FIGS. 6 to 12 will be described together with reference to FIG. 5.

Referring to FIG. 6, the cap electrode 111 is patterned and formed on the substrate 110. A first insulation layer 112 is formed on the cap electrode 111 over the entire surface of the substrate 110.

Referring to FIG. 7, the active lower electrode 113 is formed on the cap electrode 111 and the first insulation layer 112. The active lower electrode 113 is formed to overlap the cap electrode 111. The cap electrode 111 and the active lower electrode 113 overlap each other to form a capacitance. The cap electrode 111 and the active lower electrode 113 are electrodes implementing the capacitor Cst. Accordingly, the cap electrode 111 is connected to the second transistor T2 and the fourth transistor T4, and the active lower electrode 113 is the gate electrode of the driving transistor DT and is simultaneously one electrode of the capacitor Cst. The cap electrode 111 and the active lower electrode 113 may be a semiconductor such as silicon (Si) or the like or a conductive metal, for example, any one of molybdenum (Mo), aluminum (Al), chromium (Cr), gold (Au), titanium (Ti), nickel (Ni), neodymium (Nd), and copper (Cu), an alloy of two or more, or a multilayer thereof. And, a second insulation layer 114 is formed on the active lower electrode 113.

Referring to FIG. 8, the active electrodes 115D and 115S are formed on the second insulation layer 114. The active electrode 115D of the driving transistor DT is formed in a region of the active lower electrode 113 so as to overlap the active lower electrode 113. And, the active electrode 115S of the first transistor T1 is formed on the same layer as the active electrode 115D of the driving transistor DT and spaced apart from each other, but is formed adjacent to the active lower electrode 113 so as to easily contact the active lower electrode 113. The active electrodes 115D and 115S may be formed of a semiconductor material of any one of amorphous silicon, polycrystalline silicon, oxide, and organic material, but is not limited thereto. And, a third insulation layer 116 is formed on the active electrodes 115D and 115S.

Referring to FIG. 9, a CH11 contact hole CH11 is formed in the second insulation layer 114 and the third insulation layer 116 so that a surface of the active lower electrode 113 can be exposed.

Referring to FIG. 10, the active upper electrode 117 and the gate electrode 131 of the first transistor T1 are patterned and formed on the third insulation layer 116 including the CH11 contact hole CH11 exposed to the air. The active upper electrode 117 is the gate electrode of the driving transistor DT and is in contact with the active lower electrode 113 through the CH11 contact hole CH11. The active upper electrode 117 is patterned in a U-shape and overlaps the active electrode 115D of the driving transistor DT. The gate electrode 131 of the first transistor T1 is formed to overlap the active electrode 115S of the first transistor T1 and to be spaced apart from the active upper electrode 117. And, the gate electrode 131 of the first transistor T1 is formed to be elongated along the horizontal axis and may be shared with adjacent subpixels in the horizontal axis. The first transistor T1 is implemented as a top gate type transistor.

Next, referring to FIG. 5 and FIG. 10, doping is performed in order to form the active electrodes 115D and 115S that do not overlap the active upper electrode 117 and the gate electrode 131 of the first transistor T1 as source and drain regions. In this case, since it is described as an example that the transistor according to one embodiment of the present disclosure is PMOS, it may be embodied as P doping. In the case of the active upper electrode 117, the active electrode 115D of the driving transistor DT that does not overlap the active upper electrode 117 is provided the inside and outside the U-shape with respect to the active upper electrode 117, and this region is doped. By disposing the source electrode and the drain electrode the inside and outside the U-shape that does not overlap the active electrode 115D of the driving transistor DT not at a start point and an end point of the U-shape through the doping, the channel width is formed longer than the channel length, so that the driving transistor DT can generate a high current. And, the driving transistor DT is implemented as a double gate type transistor due to the active lower electrode 113 and the active upper electrode 117, thereby generating a high current.

A fourth insulation layer 118 is formed on the active upper electrode 117 and the gate electrode 131 of the first transistor T1. The fourth insulation layer 118 may serve to protect the driving transistor DT and the first transistor T1. After forming the fourth insulation layer 118, in order to activate the implanted ions and reduce the density of trap states, heat treatment such as hydrogenation may be applied, thereby improving the performance of the transistor.

The first insulation layer 112, the second insulation layer 114, the third insulation layer 116, and the fourth insulation layer 118 described above may be formed as a single layer or multiple layers made of an inorganic insulation material and may be formed of silicon oxide (SiOx), silicon nitride (SiNx) or the like.

Referring to FIG. 11, a CH14 contact hole CH14 and a CH15 contact hole CH15 are formed in the third insulation layer 116 and the fourth insulation layer 118 to expose the active electrode 115D of the driving transistor DT. The CH14 contact hole CH14 allows the source electrode of the driving transistor DT to be in contact, and the CH15 contact hole CH15 allows the drain electrode of the driving transistor DT to be in contact.

A CH13 contact hole CH13 is formed in the fourth insulation layer 118 to expose the active upper electrode 117, and a CH12 contact hole CH12 is formed in the third insulation layer 116 and the fourth insulation layer 118 to expose the active electrode 115S of the first transistor T1. The CH12 contact hole CH12 and the CH13 contact hole CH13 allow the active electrode 115S of the first transistor T1 and the active upper electrode 117 of the driving transistor DT to be in contact with each other through the connection electrode.

Referring to FIG. 12, the high potential power line 122 is patterned and formed on the fourth insulation layer 118 including the CH14 contact hole CH14 exposed to the air. The source electrode of the driving transistor DT is formed as one body with the high potential power line 122 through the CH14 contact hole CH14. The driving transistor DT receives the high potential voltage Vdd through the high potential power line 122. And, the drain electrode 119A is patterned and formed on the fourth insulation layer 118 including the CH15 contact hole CH15 exposed to the air. The drain electrode 119A is formed to overlap the active electrode 115D of the driving transistor DT and is disposed inside the active upper electrode 117 so as not to overlap the active upper electrode 117.

By disposing the active upper electrode of a curved shape over the active electrode 115D of the driving transistor DT and placing the drain electrode inside the active upper electrode 117 of the driving transistor DT and the source electrode outside, the driving transistor DT can be implemented such that the channel width W is longer than the channel length L. Accordingly, the driving transistor DT can generate a high current.

In addition, the connection electrode 119C is patterned and formed on the fourth insulation layer 118 including the CH12 contact hole CH12 and the CH13 contact hole CH13 exposed to the air. The connection electrode 119C connects the active electrode 115S of the first transistor T1 and the active upper electrode 117 of the driving transistor DT. At the same time, the first transistor T1 is also connected to the active lower electrode 113 of the driving transistor DT, which is one electrode of the capacitor Cst, so that the pixel driving circuit 40 of FIG. 2 can be implemented.

The high potential power line 122, the drain electrode 119A of the driving transistor DT, and the connection electrode 119C may be a semiconductor such as silicon (Si) or the like or a conductive metal, for example, any one of molybdenum (Mo), aluminum (Al), chromium (Cr), gold (Au), titanium (Ti), nickel (Ni), neodymium (Nd), and copper (Cu), an alloy of two or more, or a multilayer thereof.

A passivation layer may be formed on the high potential power line 122, the drain electrode 119A of the driving transistor DT, and the connection electrode 119C. In some cases, the passivation layer may separately include a protective layer protecting the pixel driving circuit 40 and a planarization layer flattening a step difference of the pixel driving circuit 40.

A CH16 contact hole CH16 is formed in the passivation layer, and the drain electrode 119A of the driving transistor DT may be in contact with the third transistor T3 or the LED element 50 through the CH16 contact hole CH16. The electrode to be in contact with the drain electrode 119A of the driving transistor DT may be formed of a transparent conductive material. The transparent conductive material may be ITO (indium tin oxide), IZO (indium zinc oxide) or the like, but is not limited thereto.

FIG. 13 is a plan view illustrating a part of a pixel driving circuit according to one embodiment of the present disclosure, and a driving transistor DT, a first transistor T1, and a capacitor Cst will be described similarly to FIG. 4. And, FIG. 14 is a cross-sectional view taken along B-B' of FIG. 13. Among the components shown in FIG. 13 and FIG. 14, structures and features of duplicated components of FIG. 4 and FIG. 5 may be briefly described or omitted.

FIG. 13 is a plan view of a driving transistor including an active upper electrode implemented in a U-shape. The driving transistor DT includes an active lower electrode 213, an active electrode 215D, an active upper electrode 217, and a drain electrode 219A. In the driving transistor DT according to one embodiment of the present disclosure, since the active upper electrode 217 is used as a source electrode and the active lower electrode 213 is used as a gate electrode, the driving transistor DT is implemented as a bottom gate type transistor. And, the first transistor T1 includes a gate electrode 231, an active electrode 215S, a source electrode, and a drain electrode.

The active upper electrode 217 of the driving transistor is implemented by being connected a high potential power line 222 through a CH22 contact hole CH22 and a CH23 contact hole CH23, and the drain electrode 219A is connected to the third transistor T3 through a CH24 contact hole CH24. In some cases, the third transistor T3 may be omitted, and the drain electrode 219A of the driving transistor DT may be connected to an anode electrode of the LED element 50.

In the driving transistor DT, the active lower electrode 213 is disposed on a lower portion and the active upper electrode 217 is disposed on an upper portion with respect to the active electrode 215D of the driving transistor DT. A cap electrode 211 overlapping the active lower electrode 213 is disposed under the active lower electrode 213 of the driving transistor DT. The active lower electrode 213 and the cap electrode 211 overlap each other to form the capacitor Cst. The cap electrode 211 may be referred to as a lower electrode.

The active lower electrode 213 of the driving transistor DT is electrically connected to a source region or a drain region of the active electrode 215S of the first transistor T1 through a connection electrode 219C. The source electrode or the drain electrode of the first transistor T1 connected to the active lower electrode 213 of the driving transistor DT may not be separately provided and may be implemented by directly connecting the connection electrode 119C to the active electrode 115S of the first transistor T1. And, the gate electrode 231 of the first transistor T1 is disposed over and overlaps the active electrode 215S.

The active upper electrode 217 of the driving transistor DT is implemented in U-shape like the electrode name. The active upper electrode 217 is used as the source electrode by applying the high potential power voltage, and the driving transistor DT having a channel width W of FIG. 12 greater than a channel length L of FIG. 12 can be implemented by disposing the drain electrode inside the active upper electrode 217. Since the driving current of the driving transistor DT is proportional to the channel width W of FIG. 12 and inversely proportional to the channel length L of FIG. 12, the driving current can be increased by increasing the channel width W of FIG. 12 more than the channel length L of FIG. 12, so that the heat concentration region can be uniformly distributed, thereby improving the reliability of the driving transistor DT.

The source electrode of the driving transistor DT is implemented in the U-shape, so that the channel width W can be increased while decreasing the area occupied by the driving transistor DT. In addition, since the capacitor Cst can be formed to overlap the driving transistor DT by implementing the driving transistor DT as the bottom gate type transistor and disposing the cap electrode 211 under the driving transistor DT, it is not necessary to prepare a separate area for forming the capacitor Cst in the subpixel, so that the area occupied by the pixel driving circuit can be reduced.

FIGS. 15 to 20 are views illustrating a method of manufacturing the components shown in FIG. 13. FIGS. 15 to 20 will be described together with reference to FIG. 14. And, portions duplicated with the description of FIGS. 6 to 12 may be omitted or simplified.

Referring to FIG. 15, the cap electrode 211 is patterned and formed on the substrate 210. A first insulation layer 212 is formed on the cap electrode 211 over the entire surface of the substrate 210.

Referring to FIG. 16, the active lower electrode 213 is formed on the cap electrode 211 and the first insulation layer 212. The active lower electrode 213 is formed to overlap the cap electrode 211. The cap electrode 211 and the active lower electrode 213 overlap each other to form a capacitance. The cap electrode 211 and the active lower electrode 213 are electrodes implementing the capacitor Cst. Accordingly, the cap electrode 211 is connected to the second transistor T2 and the fourth transistor T4, and the active lower electrode 213 is the gate electrode of the driving transistor DT and is simultaneously one electrode of the capacitor Cst. The cap electrode 211 and the active lower electrode 213 may be a semiconductor such as silicon (Si) or the like or a conductive metal, for example, any one of molybdenum (Mo), aluminum (Al), chromium (Cr), gold (Au), titanium (Ti), nickel (Ni), neodymium (Nd), and copper (Cu), an alloy of two or more, or a multilayer thereof. And, a second insulation layer 214 is formed on the active lower electrode 213.

Referring to FIG. 17, the active electrodes 215D and 215S are formed on the second insulation layer 214. The active electrode 215D of the driving transistor DT is formed in a region of the active lower electrode 213 so as to overlap the active lower electrode 213. And, the active electrode 215S of the first transistor T1 is formed on the same layer as and spaced apart from the active electrode 215D of the driving transistor DT, but is formed to partially overlap the active lower electrode 213 so as to easily contact the active lower electrode 213. And, a third insulation layer 216 is formed on the active electrodes 215D and 215S.

Referring to FIG. 18, the active upper electrode 217 and the gate electrode 231 of the first transistor T1 are patterned and formed on the third insulation layer 216. The active upper electrode 217 is the source electrode of the driving transistor DT and is patterned in a U-shape to overlap the active electrode 215D of the driving transistor DT. The gate electrode 231 of the first transistor T1 is formed to overlap the active electrode 215S of the first transistor T1 and to be spaced apart from the active upper electrode 217. And, the gate electrode 231 of the first transistor T1 is formed to be elongated along the horizontal axis and may be shared with adjacent subpixels in the horizontal axis. The first transistor T1 is implemented as a top gate type transistor.

Next, referring to FIG. 14 and FIG. 18, doping is performed in order to form the active electrodes 215D and 215S that do not overlap the active upper electrode 117 and the gate electrode 231 of the first transistor T1 as source and drain regions. In this case, since it is described as an example that the transistor according to one embodiment of the present disclosure is PMOS, it may be embodied as P doping. During doping, the active upper electrode 217 functions as a mask to dope the active electrode 215D of the driving transistor DT. The doped region is a region that does not overlap the active upper electrode 217 inside and outside the U-shape with respect to the U-shape. By forming the outside and the inside of the U-shape that does not overlap the active upper electrode 217 as the source region and the drain region, respectively, through the doping, the active electrode 215D of the driving transistor DT can be formed with the channel of the U-shape. Accordingly, the channel width of the driving transistor DT is formed longer than the channel length, so that the driving transistor DT can generate a high current.

A fourth insulation layer 218 is formed on the active upper electrode 217 and the gate electrode 231 of the first transistor T1. The fourth insulation layer 218 may serve to protect the driving transistor DT and the first transistor T1. After forming the fourth insulation layer 218, in order to activate the implanted ions and reduce the density of trap states, heat treatment for hydrogenation may be performed, thereby improving the performance of the transistor.

Referring to FIG. 19, a CH23 contact hole CH23 is formed in the third insulation layer 216 and the fourth insulation layer 218 to expose the source region of the active electrode 215D of the driving transistor DT. And, a CH22 contact hole CH22 is formed in the fourth insulation layer 218 to expose the active upper electrode 217 of the driving transistor DT. The active upper electrode 217 is connected to the source region of the active electrode 215D of the driving transistor DT through the CH23 contact hole CH23 and the CH22 contact hole CH22 and receives the high potential voltage from the high potential power line 222.

A CH21 contact hole CH21 is formed by etching the third insulation layer 216, the fourth insulation layer 218, and the active electrode 215S of the first transistor T1, thereby exposing the active lower electrode 213. The active lower electrode 213 of the driving transistor DT and the active electrode 215S of the first transistor T1 may be connected through the CH21 contact hole CH21.

The CH24 contact hole CH24 is formed in the third insulation layer 216 and the fourth insulation layer 218 to expose the drain region of the active electrode 215D of the driving transistor DT. The drain electrode may be in contact with the drain region of the driving transistor DT through the CH24 contact hole CH24.

Referring to FIG. 20, the high potential power line 222 is patterned and formed on the fourth insulation layer 218 including the CH22 contact hole CH22 and the CH23 contact hole CH23 exposed to the air. The high potential power line 222 is in contact with the active upper electrode 217 through an electrode branched from the line. And, the drain electrode 219A is patterned and formed on the fourth insulation layer 218 including the CH24 contact hole CH24 exposed to the air. The drain electrode 219A is formed to overlap the drain region of the active electrode 215D of the driving transistor DT and is disposed inside the active upper electrode 217 so as not to overlap the active upper electrode 217.

By forming the source electrode of the driving transistor DT in a U-shaped structure and to be over and overlap the active electrode 215D of the driving transistor DT, it can be implemented that the channel width W of the driving transistor DT is longer than the channel length L. Accordingly, the driving transistor DT can generate a high current.

In addition, the connection electrode 219C is patterned and formed on the fourth insulation layer 218 including the CH21 contact hole CH21 exposed to the air. The connection electrode 219A connects the active electrode 215S of the first transistor T1 and the active lower electrode 213 of the driving transistor DT. At the same time, the first transistor T1 is also connected to the active lower electrode 213 of the driving transistor DT, which is one electrode of the capacitor Cst, so that the pixel driving circuit 40 of FIG. 2 can be implemented.

A passivation layer may be formed on the high potential power line 222, the drain electrode 219A of the driving transistor DT, and the connection electrode 219C. In some cases, the passivation layer may separately include a protective layer protecting the pixel driving circuit 40 and a planarization layer flattening a step difference of the pixel driving circuit 40.

A CH25 contact hole CH25 is formed in the passivation layer, and the drain electrode 219A of the driving transistor DT may be in contact with the third transistor T3 or the LED element 50 through the CH25 contact hole CH25. The electrode to be in contact with the drain electrode 219A of the driving transistor DT may be formed of a transparent conductive material.

FIG. 21 is a plan view illustrating a part of a pixel driving circuit according to one embodiment of the present disclosure, and a driving transistor and a first transistor T1 will be described. FIG. 22 is a cross-sectional view taken along C-C' of FIG. 21.

FIG. 21 is a plan view of a driving transistor including an active upper electrode implemented in an O-shape. The driving transistor DT includes an active lower electrode 313, an active upper electrode 317, an active electrode 315D, a source electrode, and a drain electrode 319A. In the driving transistor DT according to one embodiment of the present disclosure, the active upper electrode 317 is used as a gate electrode, and the driving transistor DT is implemented as a top gate type transistor. And, the first transistor T1 includes a gate electrode 331, an active electrode 315S, a source electrode, and a drain electrode.

The source electrode of the driving transistor DT is implemented by being directly connected to a high potential power line 322 through a CH34 contact hole CH34, and the drain electrode 319A is connected to the third transistor T3 through a CH35 contact hole CH35. In some cases, the third transistor T3 may be omitted, and the drain electrode 319A of the driving transistor DT may be connected to an anode electrode of the LED element 50.

The driving transistor DT is formed on a substrate 310 such that an active lower electrode 313 is disposed on a lower portion and the active upper electrode 317 is disposed on an upper portion with respect to the active electrode 315D of the driving transistor DT. The active lower electrode 313 overlaps the active upper electrode 317 and the active electrode 315D of the driving transistor DT. The active lower electrode 313 may be omitted in some cases.

The active lower electrode 313 is formed on a first insulation layer 312 formed on the substrate 310. The first insulation layer 312 increases the adhesion of the active lower electrode 313 to the substrate 310. In some cases, the first insulation layer 312 may be omitted. And, a second insulation layer 314 is formed on the active lower electrode 313.

The active electrode 315D of the driving transistor DT and the active electrode 315S of the first transistor T1 are formed on the second insulation layer 314. The active electrode 315D of the driving transistor DT is disposed to partially overlap the active lower electrode 313. And, the active electrode 315S of the first transistor T1 is formed on the same layer as and spaced apart from the active electrode 315D of the driving transistor DT and is formed adjacent to the active upper electrode 317 so as to easily contact the active upper electrode 317 of the driving transistor DT. And, a third insulation layer 316 is formed on the active electrodes 315S and 315D.

An active upper electrode 317 of the driving transistor DT and the gate electrode 331 of the first transistor T1 are formed on the third insulation layer 316. The active upper electrode 317 of the driving transistor DT is disposed over and overlaps the active electrode 315D of the driving transistor DT, and the gate electrode 331 of the first transistor T1 is disposed over and overlaps the active electrode 315S of the first transistor T1. In this case, the first transistor T1 and the driving transistor DT may be implemented as top gate type transistors.

The active upper electrode 317 of the driving transistor DT is implemented in a sealed doughnut-shaped structure. A source region and a drain region may be provided outside and inside the O-shape so as to contact the source electrode and the drain electrode, respectively. Doping is performed in order to form the active electrodes 315D and 315S that do not overlap the active upper electrode 317 and the gate electrode 331 of the first transistor T1 as the source region and the drain region. In this case, since it is described as an example that the transistor according to one embodiment of the present disclosure is PMOS, it may be embodied as P doping. By connecting the drain electrode and the source electrode to the inside and the outside of the active upper electrode 317 made conductive through doping, respec- tively, the driving transistor DT having the channel width greater than the channel length can be implemented.

Since the driving current of the driving transistor DT is proportional to the channel width W and inversely propor- tional to the channel length L, by increasing the channel width W more than the channel length L, the driving current can be increased and the distribution of the driving current can be made uniform, and since the heat concentration region can be uniformly distributed, the reliability of the driving transistor DT can be improved. In addition, by implementing the gate electrode of the driving transistor DT in the O-shape, the area occupied by the driving transistor DT is decreased, so that it can be also easily applied to a high-resolution display panel.

Next, a fourth insulation layer 318 is formed on the active upper electrode 317 of the driving transistor DT and the gate electrode 331 of the first transistor T1. A CH31 contact hole CH31 is formed in the third insulation layer 316 and the fourth insulation layer 318 to expose the source region or the drain region of the active electrode 315S of the first tran- sistor T1. And, a CH32 contact hole CH32 is formed in the fourth insulation layer 318 to expose the active upper electrode 317. The CH31 contact hole CH31 and the CH32 contact hole CH32 allow the source region of the first transistor T1 and the gate electrode of the driving transistor DT to be in contact with each other through a connection electrode.

A CH34 contact hole CH34 and a CH35 contact hole CH35 are formed in the third insulation layer 316 and the fourth insulation layer 318 to expose the source region and the drain region of the active electrode 315D of the driving transistor DT. The CH34 contact hole CH34 allows the source region of the driving transistor to be in contact with the high potential power line 332, and the CH35 contact hole CH35 allows the drain region of the driving transistor DT to be in contact with the drain electrode 319A.

A CH33 contact hole CH33 is formed in the second insulation layer 314, the third insulation layer 316, and the fourth insulation layer 318 to expose the active lower electrode 313. The CH33 contact hole CH33 makes the active lower electrode 313 be in contact with the high potential power line 322 such that the active lower electrode 313 is not floating.

The high potential power line 322, the drain electrode 319A of the driving transistor DT, and the connection electrode 319C are patterned and formed on the fourth insulation layer 318. The high potential power line 322 may be formed along a vertical axis including the CH34 contact hole CH34 and the CH33 contact hole CH33. The drain electrode 319A of the driving transistor DT covers the CH35 contact hole CH35, and the connection electrode 319C covers the CH31 contact hole CH31 and the CH32 contact hole CH32.

A passivation layer may be formed on the high potential power line 322, the drain electrode 319A of the driving transistor DT, and the connection electrode 319C. In some cases, the passivation layer may separately include a pro- tective layer protecting the pixel driving circuit 40 and a planarization layer flattening a step difference of the pixel driving circuit 40.

FIG. 23 is a plan view illustrating a part of a pixel driving circuit according to one embodiment of the present disclo- sure. FIG. 24 is a cross-sectional view taken along D-D' of FIG. 23. Since FIG. 23 is a modified embodiment of FIG. 4 and FIG. 21, descriptions duplicated with FIG. 4, FIG. 5, FIGS. 6 to 12, FIG. 21, and FIG. 22 may be simplified or omitted.

FIG. 23 is a plan view of a driving transistor including an active upper electrode implemented in an O-shape. The driving transistor DT includes an active lower electrode 413, an active upper electrode 417, an active electrode 415D, a source electrode, and a drain electrode 419A. In the driving transistor DT according to one embodiment of the present disclosure, since the active lower electrode 413 and the active upper electrode 417 are used as gate electrodes, the driving transistor DT is implemented as a double gate type transistor. And, the first transistor T1 includes a gate electrode 431, an active electrode 415S, a source electrode, and a drain electrode.

The source electrode of the driving transistor DT is implemented by being directly connected to a high potential power line 422 through a CH43 contact hole CH43, and the drain electrode 419A is connected to the third transistor T3 through a CH44 contact hole CH44. In some cases, the third transistor T3 may be omitted, and the drain electrode 419A of the driving transistor DT may be connected to an anode electrode of the LED element 50.

In the driving transistor DT, the active lower electrode 413 is disposed on a lower portion and the active upper electrode 417 is disposed on an upper portion with respect to the active electrode 415D of the driving transistor DT, and the active lower electrode 413 and the active upper electrode 417 are in contact with each other. A cap electrode 411 overlapping the active lower electrode 413 is disposed under the active lower electrode 413 of the driving transistor DT. The active lower electrode 413 and the cap electrode 411 overlap each other to form the capacitor Cst.

The gate electrodes 413 and 417 of the driving transistor DT are electrically connected to a source region or a drain region of the active electrode 415S of the first transistor T1 through a connection electrode 419C. The source electrode or the drain electrode of the first transistor T1 connected to the gate electrodes 413 and 417 of the driving transistor DT may not be separately provided and may be implemented by directly connecting the connection electrode 419C to the active electrode 415S of the first transistor T1.

The gate electrode 431 of the first transistor T1 is disposed over and overlaps the active electrode 415S.

The active upper electrode 417 of the driving transistor DT is implemented in the same shape as the active upper electrode 317 of the driving transistor DT included in FIG. 21. A source region and a drain region may be provided outside and inside the active upper electrode 417 so as to contact the source electrode and the drain electrode, respectively. By forming the source region and the drain region in the active electrode 415D through doping and connecting the drain electrode and the source electrode to the inside and the outside of the active upper electrode 417 made conductive, respectively, the driving transistor DT having the channel width W of FIG. 21 greater than the channel length L of FIG. 21 can be implemented. Accordingly, the driving current of the driving transistor DT can be increased, the distribution of the driving current can be made uniform, and the heat concentration region can be uniformly distributed, so that the reliability of the driving transistor DT can be improved. In addition, by implementing the gate electrode of the driving transistor DT in the O-shape, the area occupied by the driving transistor DT is decreased, so that it can be also easily applied to a high-resolution display panel. In addition, since the capacitor Cst can be formed to overlap the driving transistor DT by implementing the driving transistor DT as a double gate type transistor and disposing the cap electrode 411 under the driving transistor DT, it is not necessary to prepare a separate area for forming the capacitor Cst in the subpixel, so that the area occupied by the pixel driving circuit can be reduced.

The cap electrode 411 is formed on a substrate 410, a first insulation layer 412 is formed on the cap electrode 411, the active lower electrode 413 is formed on the first insulation layer 412, a second insulation layer 414 is formed on the active lower electrode 413, the active electrode 415D of the driving transistor DT and the active electrode 415S of the first transistor T1 are formed on the second insulation layer 414, a third insulation layer 416 is formed on the active electrodes 415D and 415S, the active upper electrode 417 of the driving transistor DT and the gate electrode 431 of the first transistor T1 are formed on the third insulation layer 416, and a fourth insulation layer 418 is formed on the gate electrodes 417 and 413. And, the connection electrode 419C is formed on the fourth insulation layer 418. In this case, the source region or the drain region of the active electrode 415S of the first transistor T1 overlaps the active lower electrode 413 such that a CH41 contact hole CH41 for providing the connection electrode 419C in the overlapping region can be formed.

The CH41 contact hole CH41 is formed in the second insulation layer 414, the active electrode 415S of the first transistor T1, the third insulation layer 416, and the fourth insulation layer 418 to expose a surface of the active lower electrode 413 and a side surface of the active electrode 415S of the first transistor T1, and a CH42 contact hole CH42 is formed in the fourth insulation layer 418 to expose the active upper electrode 417. The connection electrode 419C is formed to include the CH41 contact hole CH41 and the CH42 contact hole CH42, and the connection electrode 419C is in contact with and electrically connects the active lower electrode 413, the active upper electrode 417, and the active electrode 415S of the first transistor T1. In this case, the active electrode 415S of the first transistor T1 and the active lower electrode 413 of the driving transistor are connected as one body by the same contact hole, but is not limited thereto, and as in the structure of FIG. 4 and FIG. 5, the active electrode 415S of the first transistor T1 and the active lower electrode 413 of the driving transistor may be connected by different contact holes.

The CH43 contact hole CH43 and the CH44 contact hole CH44 are formed in the third insulation layer 416 and the fourth insulation layer 418 to expose the active electrode 415D of the driving transistor DT. The CH43 contact hole CH43 allows the source electrode of the driving transistor DT to be in contact, and the CH44 contact hole CH44 allows the drain electrode of the driving transistor DT to be in contact. The source electrode of the driving transistor DT is formed as one body with the high potential power line 422 through the CH43 contact hole CH43. The driving transistor DT receives the high potential voltage Vdd through the high potential power line 422.

FIG. 25 is a plan view illustrating a part of a pixel driving circuit according to one embodiment of the present disclosure. FIG. 26 is a cross-sectional view taken along E-E' of FIG. 25. Since FIG. 25 is a modified embodiment of FIG. 13 and FIG. 21, descriptions duplicated with FIG. 13, FIG. 14, FIGS. 15 to 20, FIG. 21, and FIG. 22 may be simplified or omitted.

FIG. 25 is a plan view of a driving transistor including an active upper electrode implemented in an O-shape. The driving transistor DT includes an active lower electrode 513, an active upper electrode 517, an active electrode 515D, a source electrode, and a drain electrode 519A. In the driving transistor DT according to one embodiment of the present disclosure, since the active upper electrode 517 is used as a source electrode and the active lower electrode 513 is used as a gate electrode, the driving transistor DT is implemented as a bottom gate type transistor. And, the first transistor T1 includes a gate electrode 531, an active electrode 515S, a source electrode, and a drain electrode.

The active upper electrode 517 of the driving transistor DT is implemented by being connected to a high potential power line 522 through a CH52 contact hole CH52 and a CH53 contact hole CH53, and the drain electrode 519A is connected to the third transistor T3 through a CH54 contact hole CH54. In some cases, the third transistor T3 may be omitted, and the drain electrode 519A of the driving transistor DT may be connected to an anode electrode of the LED element 50.

In the driving transistor DT, the active lower electrode 513 is disposed on a lower portion and the active upper electrode 517 is disposed on an upper portion with respect to the active electrode 515D of the driving transistor DT. A cap electrode 511 overlapping the active lower electrode is disposed under the active lower electrode 513 of the driving transistor DT. The active lower electrode 513 and the cap electrode 511 overlap each other to form the capacitor Cst.

The active lower electrode 513 of the driving transistor DT is electrically connected to a source region or a drain region of the active electrode 515S of the first transistor T1 through a connection electrode 519C. The source electrode or the drain electrode of the first transistor T1 connected to the active lower electrode 513 of the driving transistor DT may not be separately provided and may be implemented by directly connecting the connection electrode 519C to the active electrode 515S of the first transistor T1. And, the gate electrode 531 of the first transistor T1 is disposed over and overlaps the active electrode 515S.

The active upper electrode 517 of the driving transistor DT is implemented in the same shape as the active upper electrode 317 of the driving transistor DT included in FIG. 21. A source region and a drain region may be provided outside and inside the active upper electrode 517 so as to contact the source electrode and the drain electrode, respectively. By forming the source region and the drain region in the active electrode 515D through doping and connecting the drain electrode and the source electrode to the inside and the outside of the active upper electrode 517 made conductive, respectively, the driving transistor DT having the channel width greater than the channel length can be implemented. Accordingly, the driving current of the driving transistor DT can be increased, the distribution of the driving current can be made uniform, and the heat concentration region can be uniformly distributed, so that the reliability of the driving transistor DT can be improved. In addition, by implementing the gate electrode of the driving transistor DT in the O-shape, the area occupied by the driving transistor DT is decreased, so that it can be also easily applied to a high-resolution display panel. In addition, since the capacitor Cst can be formed to overlap the driving transistor DT by disposing the cap electrode 511 under the driving transistor DT, it is not necessary to prepare a separate area for forming the capacitor Cst in the subpixel, so that the area occupied by the pixel driving circuit can be reduced.

The cap electrode 511 is formed on a substrate 510, a first insulation layer 512 is formed on the cap electrode 511, the active lower electrode 513 is formed on the first insulation layer 512, a second insulation layer 514 is formed on the active lower electrode 513, the active electrode 515D of the driving transistor DT and the active electrode 515S of the first transistor T1 are formed on the second insulation layer 514, a third insulation layer 516 is formed on the active electrodes 515D and 515S, the active upper electrode 517 of the driving transistor DT and the gate electrode 531 of the first transistor T1 are formed on the third insulation layer 516, and a fourth insulation layer 518 is formed on the gate electrodes 517 and 513. And, the connection electrode 519C is formed on the fourth insulation layer 518. In this case, the source region or the drain region of the active electrode 515S of the first transistor T1 overlaps the active lower electrode 513 such that a CH51 contact hole CH51 for providing the connection electrode 519C in the overlapping region can be formed.

The CH51 contact hole CH51 is formed in the second insulation layer 514, the active electrode 515S of the first transistor T1, the third insulation layer 516, and the fourth insulation layer 518 to expose a surface of the active lower electrode 513 and a side surface of the active electrode 515S of the first transistor T1. The connection electrode 519C is formed to include the CH51 contact hole CH51, and the connection electrode 519C is in contact with and electrically connects the active lower electrode 513 and the active electrode 515S of the first transistor T1.

The CH52 contact hole CH52 and the CH54 contact hole CH54 are formed in the third insulation layer 516 and the fourth insulation layer 518 to expose the active electrode 515D of the driving transistor DT. The CH52 contact hole CH52 allows the source electrode of the driving transistor DT to be in contact, and the CH54 contact hole CH54 allows the drain electrode of the driving transistor DT to be in contact. The source electrode of the driving transistor DT is formed as one body with the high potential power line 522 through the CH52 contact hole CH52. The driving transistor DT receives the high potential voltage Vdd through the high potential power line 522. And, the CH53 contact hole CH53 is formed in the fourth insulation layer 518 to expose the active upper electrode 517 of the driving transistor DT. The high potential power line 522 is in contact with the active upper electrode 517 through an electrode branched from the line. By forming the source electrode of the driving transistor DT in an O-shaped structure and to be over and overlap the active electrode 515D of the driving transistor DT, it can be implemented that the channel width W of FIG. 21 of the driving transistor DT is longer than the channel length L of FIG. 21. Accordingly, the driving transistor DT can generate a high current.

So far, a method of manufacturing some components of a pixel driving circuit according to one embodiment of the present disclosure has been described.

In a display panel according to one embodiment of the present disclosure, the display panel includes a substrate, an active electrode over the substrate and including a source region, a drain region, and a channel region, and an active upper electrode of a curved shape over the active electrode. The channel region of the active electrode and the active upper electrode may overlap each other and the channel region may have a same shape as the active upper electrode. Accordingly, a driving element included in the display panel may generate a high driving current and the degree of integration in a pixel may be improved.

According to another feature of the present disclosure, the display panel may further include a lower electrode over the substrate and an active lower electrode between the substrate and active electrode, and the lower electrode and the active lower electrode may overlap each other to be implemented as a capacitor.

According to another feature of the present disclosure, the display panel may further include a lower electrode between the substrate and active electrode, and the active upper electrode and the active lower electrode may be connected to each other by a connection electrode to be implemented as a double gate type transistor.

In a display panel according to one embodiment of the present disclosure, the display panel includes an active electrode including a source region, a drain region, and a channel region, an active upper electrode over the active electrode, overlapping the active electrode, and implemented in a curved shape, and an active lower electrode under the active electrode and overlapping the active electrode. The active upper electrode and the active lower electrode serve as a source electrode, a drain electrode, or a gate electrode. Accordingly, a driving element included in the display panel may generate a high driving current and the degree of integration in a pixel may be improved.

In a display panel according to one embodiment of the present disclosure, the display panel includes a substrate, a lower electrode over the substrate, an active electrode over the lower electrode and including a source region, a drain region, and a channel region, a drain electrode contacting the drain region of the active electrode, a source electrode or an upper gate electrode over the active electrode, and an active lower electrode under the active electrode. And, the lower electrode, the active lower electrode, and the channel region of the active electrode overlap each other, and the source electrode or the upper gate electrode is implemented in a curved shape. Accordingly, a driving element included in the display panel may generate a high driving current and the degree of integration in a pixel may be improved.

According to another feature of the present disclosure, the lower electrode and the active lower electrode may overlap each other to be implemented as a capacitor.

According to another feature of the present disclosure, the upper gate electrode and the active lower electrode may be connected to each other by a connection electrode to be implemented as a double gate type transistor.

According to another feature of the present disclosure, the source electrode or the upper gate electrode may overlap the active electrode, the active electrode have a region that does not overlap the source electrode or the upper gate electrode, and the non-overlapping region of the active electrode may be divided into two regions, an inside region of the curved shape of the source electrode or the upper gate electrode and an outside region of the curved shape. And, the inside region of the active electrode may be a drain region, and an outside region of the active electrode may be a source region.

According to another feature of the present disclosure, the curved shape may be implanted as a U-shape or an O-shape.

According to another feature of the present disclosure, the display panel may further include an LED element and a high potential power line providing a high potential voltage, the source electrode may be implemented as one body with the high potential power line, and the drain electrode may be connected to the LED element.

According to another feature of the present disclosure, the high potential power line may be branched to being in contact with the source electrode of a curved shape.

In a thin film transistor according to one embodiment of the present disclosure, the thin film transistor includes an active electrode including a source region, a drain region, and a channel region, an electrode over the active electrode and overlapping the active electrode, and an electrode under the active electrode and overlapping the active electrode. And, the electrode under the active electrode is a gate electrode, and the electrode over the active electrode is implemented in a curved shape to serve as a source electrode or a gate electrode. Accordingly, the thin film transistor may generate a high driving current.

According to another feature of the present disclosure, the channel region may be a region overlapping the electrode over the active electrode.

According to another feature of the present disclosure, the channel region may have a width and a length, and the width of the channel region may be greater than the length of the channel region.

According to another feature of the present disclosure, the electrode over the active electrode and the electrode under the active electrode may be connected to each other.

According to another feature of the present disclosure, the electrode implemented in the curved shape may be a U-shape or an O-shape. And, the electrode implemented in the curved shape may divide the active electrode into two regions.

According to another feature of the present disclosure, the electrode over the active electrode may be a source electrode, and the electrode under the active electrode may be a gate electrode.

Although the embodiments of the present disclosure have been described above in more detail with reference to the accompanying drawings, the present disclosure is not necessarily limited to these embodiments, and various modifications may be made within the scope without departing from the technical spirit of the present disclosure. Accordingly, the embodiments disclosed in the present disclosure are not intended to limit the technical spirit of the present disclosure, but to explain, and the scope of the technical spirit of the present disclosure is not limited by theses embodiments. Therefore, it should be understood that the embodiments described above are illustrative in all respects and not restrictive. The scope of the protection of the present disclosure should be construed by claims, and all technical spirit within the scope equivalent thereto should be construed as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
a substrate;
an active layer over the substrate and including a source region, a drain region, and a channel region;
an active upper electrode of a curved shape over the active layer;
a drain electrode contacting the drain region; and
a source electrode contacting the source region; and an LED element coupled to the source electrode or the drain electrode, the LED element including an inorganic material as a light emitting layer, wherein the channel region of the active layer and the active upper electrode overlap each other and the channel region has a same shape as the active upper electrode, wherein a thin film transistor including the active layer, the active upper electrode of the curved shape, and the source electrode is provided over the substrate, and the active upper electrode of the curved shape is a gate electrode of the thin film transistor, and wherein only one of the drain electrode and the source electrode is coupled to the LED element including the inorganic material and overlaps the active upper electrode of the curved shape.

2. The display panel of claim 1, further comprising:
a lower electrode over the substrate; and
an active lower electrode between the substrate and active layer,
wherein the lower electrode and the active lower electrode overlap each other to be implemented as a capacitor.

3. The display panel of claim 1, further comprising:
an active lower electrode between the substrate and active layer,
wherein the active upper electrode and the active lower electrode are coupled to each other by a connection electrode to be implemented as a double gate type transistor.

4. The display panel of claim 1, wherein a region of the active layer that does not overlap the active upper electrode is divided into an inside region and an outside region of the channel region.

5. The display panel of claim 4, wherein the inside region of the active layer is the drain region, and the outside region of the active layer is the source region.

6. The display panel of claim 1, wherein the curved shape is an O-shape.

7. The display panel of claim 1, further comprising:
a high potential power line providing a high potential voltage,
wherein the source electrode is implemented as one body with the high potential power line, and the drain electrode is coupled to the LED element.

8. A display panel comprising:
a substrate;
an active layer over the substrate and including a source region, a drain region, and a channel region;
an active upper electrode of a curved shape over the active layer; and
a high potential power line providing a high potential voltage,
wherein a thin film transistor including the active layer and the active upper electrode of the curved shape is provided over the substrate, and the active upper electrode of the curved shape is a source electrode of the thin film transistor, and
wherein the high potential power line is branched to overlapping and being in contact with the source electrode of the curved shape.

9. A thin film transistor comprising:
an active layer including a source region, a drain region, and a channel region;
an active upper electrode over the active layer, overlapping the active layer, and implemented in a curved shape in a plan;
a drain electrode contacting the drain region;

a source electrode contacting the source region; and
an active lower electrode under the active layer and overlapping the active layer,
wherein the active upper electrode of the curved shape serves as a gate electrode, and
wherein the source electrode and the drain electrode do not have a curved shape and are spaced apart from the active upper electrode of the curved shape.

10. The thin film transistor of claim 9, wherein the channel region is a region overlapping the active upper electrode.

11. The thin film transistor of claim 9, wherein the channel region has a width and a length, and the width of the channel region is greater than the length of the channel region.

12. The thin film transistor of claim 9, wherein the active upper electrode and the active lower electrode are coupled to each other.

13. The thin film transistor of claim 9, wherein the active upper electrode is a U-shape.

14. The thin film transistor of claim 13, wherein the active upper electrode divides the active layer into two regions.

15. The thin film transistor of claim 9, further comprising a lower electrode overlapping the active lower electrode,
wherein the active lower electrode is disposed between the active layer and the lower electrode.

16. A display device comprising:
a display panel;
a high potential power line providing a high potential voltage; and
a thin film transistor coupled to the display panel, the thin film transistor including:
an active layer including a source region, a drain region, and a channel region;
an active upper electrode over the active layer, overlapping the active layer, and implemented in a curved shape; and
an active lower electrode under the active layer and overlapping the active layer,
wherein the active upper electrode of the curved shape serves as a source electrode, and
wherein the high potential power line is branched to overlapping and being in contact with the active upper electrode of the curved shape.

17. The display device of claim 16, wherein the channel region is a region overlapping the active lower electrode and being spaced apart from the active upper electrode.

18. The display device of claim 16, wherein the channel region has a width and a length, and the width of the channel region is greater than the length of the channel region.

19. The display device of claim 16, wherein the active upper electrode and the active lower electrode overlap each other.

20. The display device of claim 16, further comprising a lower electrode overlapping the active lower electrode,
wherein the active lower electrode is disposed between the active layer and the lower electrode.

21. The display device of claim 16, wherein the thin film transistor further includes a drain electrode over the active layer, and
wherein the drain electrode partially overlaps the active upper electrode of the curved shape.

22. The display panel of claim 1, wherein the curved shape is a closed O-shape having an opening, and
wherein one end of the drain electrode is disposed in the opening.

23. The display panel of claim 9, wherein the drain electrode extends in a first direction, and the source electrode extends in a second direction crossing the first direction, and wherein the curved shape is a U-shape with ends spaced apart from each other in the second direction.

\* \* \* \* \*